(12) United States Patent
Kyeon et al.

(10) Patent No.: US 9,525,065 B1
(45) Date of Patent: Dec. 20, 2016

(54) SEMICONDUCTOR DEVICES INCLUDING A CHANNEL PAD, AND METHODS OF MANUFACTURING SEMICONDUCTOR DEVICES INCLUDING A CHANNEL PAD

(71) Applicants: Dong Min Kyeon, Seongnam-si (KR); Woong Seop Lee, Hwaseong-si (KR); Jin Hyun Shin, Suwon-si (KR)

(72) Inventors: Dong Min Kyeon, Seongnam-si (KR); Woong Seop Lee, Hwaseong-si (KR); Jin Hyun Shin, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/979,122

(22) Filed: Dec. 22, 2015

Related U.S. Application Data

(60) Provisional application No. 62/240,913, filed on Oct. 13, 2015.

(30) Foreign Application Priority Data

Nov. 11, 2015 (KR) .................. 10-2015-0158365

(51) Int. Cl.
| | | |
|---|---|---|
| H01L 29/66 | (2006.01) | |
| H01L 21/20 | (2006.01) | |
| H01L 29/78 | (2006.01) | |
| H01L 27/115 | (2006.01) | |

(52) U.S. Cl.
CPC ..... *H01L 29/7827* (2013.01); *H01L 27/11556* (2013.01); *H01L 27/11582* (2013.01)

(58) Field of Classification Search
CPC .... H01L 21/76886; H01L 22/14; H01L 27/24; H01L 27/26; H01L 27/3279; H01L 27/329; H01L 45/04; H01L 2924/30101

USPC ........... 257/290, 288, 222, 321, 324, 402, 330,257/329, 334, 296, 360; 438/488, 382, 270, 438/427, 57, 282, 206, 197, 268, 305, 204, 149

See application file for complete search history.

(56) References Cited

U.S. PATENT DOCUMENTS

| | | | |
|---|---|---|---|
| 8,927,366 B2 | 1/2015 | Lee et al. | |
| 9,082,655 B2 | 7/2015 | Youm et al. | |
| 2003/0164527 A1* | 9/2003 | Sugi ................... | H01L 21/8234 257/401 |
| 2008/0003866 A1* | 1/2008 | Bae ................... | H01L 21/76805 439/417 |
| 2011/0147824 A1* | 6/2011 | Son ................... | G11C 16/0483 257/324 |
| 2013/0089974 A1* | 4/2013 | Lee ................... | H01L 27/11556 438/510 |
| 2014/0264549 A1 | 9/2014 | Lee | |

FOREIGN PATENT DOCUMENTS

| | | | |
|---|---|---|---|
| JP | | 3160545 B2 | 4/2001 |
| JP | | 3507678 B2 | 3/2004 |
| JP | | 3698801 B2 | 9/2005 |
| JP | | 4542488 B2 | 9/2010 |
| KR | 10-2006-0075366 | | 7/2006 |
| KR | | 10-0877255 B1 | 1/2009 |

* cited by examiner

*Primary Examiner* — Julio J Maldonado
*Assistant Examiner* — Moin Rahman
(74) *Attorney, Agent, or Firm* — Myers Bigel, P.A.

(57) ABSTRACT

Semiconductor devices are provided. A semiconductor device includes a stack of gate electrodes. The semiconductor device includes a channel material in a channel recess in the stack. The semiconductor device includes a channel pad on the channel insulating layer. The channel pad has a curved upper surface. Methods of manufacturing semiconductor devices are also provided.

16 Claims, 23 Drawing Sheets

SEMICONDUCTOR DEVICES INCLUDING A CHANNEL PAD, AND METHODS OF MANUFACTURING SEMICONDUCTOR DEVICES INCLUDING A CHANNEL PAD

CROSS-REFERENCE TO RELATED APPLICATIONS

This U.S. non-provisional patent application claims priority under 35 U.S.C. §119 to U.S. Provisional Application No. 62/240,913, filed on Oct. 13, 2015, in the USPTO, and to Korean Patent Application No. 10-2015-0158365, filed on Nov. 11, 2015, in the Korean Intellectual Property Office, the disclosures of which are hereby incorporated herein by reference in their entireties.

BACKGROUND

The present disclosure relates to semiconductor devices and methods of manufacturing the same. Market demand may exist for electronic products to be capable of processing large amounts of data, while sizes of electronic products may decrease. Accordingly, degrees of integration of semiconductor devices used in such electronic products may increase. As an approach to increasing the degree of integration of semiconductor devices, a semiconductor device may have a vertical transistor structure instead of a planar transistor structure.

SUMMARY

Various embodiments of present inventive concepts may provide a semiconductor device having improved reliability.

According some embodiments of present inventive concepts, a semiconductor device may include a substrate. The semiconductor device may include gate electrodes stacked vertically on the substrate. The semiconductor device may include channel holes penetrating through the gate electrodes to extend in a direction perpendicular to the substrate. The channel holes may have respective channel regions therein. Moreover, the semiconductor device may include channel pads connected to the channel regions in respective upper portions of the channel holes, and the channel pads may have respective convex upper surfaces.

In some embodiments, the convex upper surfaces of the channel pads may be dome-shaped upper surfaces that extend away from the substrate. Additionally or alternatively, lower surfaces of the channel pads may have an opposite curvature of that of the convex upper surfaces of the channel pads.

According to some embodiments, the semiconductor device may include first and second insulating layers that have an interface with each other adjacent the convex upper surfaces of the channel pads. The first insulating layer may be between the second insulating layer and the substrate. Moreover, the channel pads may protrude from the first insulating layer toward the second insulating layer.

In some embodiments, the channel pads may include a p-type impurity or an n-type impurity. Moreover, the semiconductor device may include a gate dielectric layer between the gate electrodes and the channel region of one of the channel holes. The gate dielectric layer may extend along a side surface of the channel pad that is in the one of the channel holes.

According to some embodiments, the channel region of one of the channel holes may extend along a side surface of the channel pad that is in the one of the channel holes.

Additionally or alternatively, respective lower surfaces of the channel pads may have widths that are narrower than respective widths of the convex upper surfaces of the channel pads.

A semiconductor device, according to some embodiments, may include a substrate. The semiconductor device may include gate electrodes stacked vertically on the substrate. The semiconductor device may include channel holes penetrating through the gate electrodes to extend in a direction perpendicular to the substrate. The channel holes may have respective channel regions therein. The semiconductor device may include channel pads in respective upper portions of the channel holes. Respective portions of the channel pads may protrude from the channel holes. Moreover, the channel pads may have respective upper surfaces that curve in a direction different from that of respective lower surfaces of the channel pads.

A method of manufacturing a semiconductor device, according to some embodiments, may include forming a stacked structure by alternately stacking sacrificial layers and interlayer insulating layers on a substrate. The method may include forming a first insulating layer and a mask layer on the stacked structure. The method may include forming channel holes that penetrate through the stacked structure and the first insulating layer, using the mask layer. The method may include forming gate dielectric layers and channel regions on sidewalls of the channel holes. The method may include forming channel insulating layers filling lower portions of the channel holes. The method may include forming a conductive layer filling upper portions of the channel holes on the channel insulating layers. The conductive layer may extend onto the mask layer. Moreover, the method may include forming channel pads having convex upper surfaces, by removing the conductive layer from an upper portion of the mask layer such that the conductive layer remains only in the channel holes.

In some embodiments, forming the channel pads may include removing portions of the conductive layer by a planarization process that uses the first insulating layer as an etch-stop layer. The planarization process may remove an entirety of the mask layer without removing the first insulating layer.

According to some embodiments, at least portions of the convex upper surfaces of the channel pads may protrude from the first insulating layer. Additionally or alternatively, the mask layer may include a first mask layer and a second mask layer formed on the first mask layer. Moreover, the forming of the channel pads may include removing a portion of the conductive layer, using the first mask layer as an etch-stop layer, and may include removing the first mask layer, using the first insulating layer as an etch-stop layer.

In some embodiments, the method may include, after the forming of the channel insulating layers, removing the second mask layer by a planarization process, using the first mask layer as an etch-stop layer. The first mask layer and the second mask layer may be formed of different materials.

According to some embodiments, the forming of the channel insulating layers may includes depositing an insulating material to fill the channel holes, and may include performing an etch-back process to remove the insulating material from the upper portions of the channel holes. The etch-back process may define upper surfaces of the channel insulating layers that have a concave upward shape. Moreover, the channel pads may have downwardly convex lower surfaces adjacent respective ones of the upper surfaces of the channel insulating layers.

In some embodiments, a thickness of the first insulating layer may range from 1.5 times to 2.5 times thicknesses of the channel pads. The thickness of the first insulating layer may range from about 1000 Å to about 2200 Å. Moreover, the method may include replacing the sacrificial layers with gate electrodes, after forming the channel pads. Additionally or alternatively, the method may include forming a second insulating layer on the channel pads.

A method of manufacturing a semiconductor device, according to some embodiments, may include forming a stacked structure by alternately stacking sacrificial layers and interlayer insulating layers on a substrate. The method may include forming an insulating layer on the stacked structure. The method may include forming channel holes to penetrate through the stacked structure and the insulating layer. The method may include forming gate dielectric layers, channel regions, and channel insulating layers in the channel holes. Moreover, the method may include forming channel pads having convex upper surfaces in upper portions of the channel holes. At least some of the channel pads may protrude from the insulating layer. In some embodiments, a thickness of the insulating layer may range from 1.5 times to 2.5 times thicknesses of the channel pads.

A semiconductor device, according to some embodiments, may include a stack of alternating interlayer insulating layers and gate electrodes. The semiconductor device may include a channel material in a channel recess in the stack. The semiconductor device may include a channel insulating layer on the channel material, in the channel recess. Moreover, the semiconductor device may include a channel pad on the channel insulating layer. The channel pad may have a convex upper surface.

In some embodiments, the semiconductor device may include an insulating layer on the stack. A portion of the channel pad may protrude beyond an upper surface of the insulating layer. Moreover, a portion of the channel material may protrude beyond the upper surface of the insulating layer, and the semiconductor device may include a gate dielectric layer between some of the gate electrodes and the channel material.

According to some embodiments, the channel recess may be one among a plurality of channel recesses in the stack. The channel pad may be one among a plurality of channel pads that correspond to the plurality of channel recesses, respectively. Moreover, the convex upper surface of the channel pad may be one among a plurality of dome-shaped upper surfaces of the plurality of channel pads, respectively, protruding beyond the upper surface of the insulating layer.

In some embodiments, the insulating layer that is on the stack may be thicker than individual ones of the interlayer insulating layers, and may be 1.5 to 2.5 times thicker than the channel pad. The insulating layer may be 1000 Å to 2200 Å thick. For example, the insulating layer may be 1500 Å to 2000 Å thick.

According to some embodiments, a first width of the convex upper surface of the channel pad may be wider than a second width of a lower surface of the channel pad. Additionally or alternatively, the semiconductor device may include a contact plug on the convex upper surface of the channel pad.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
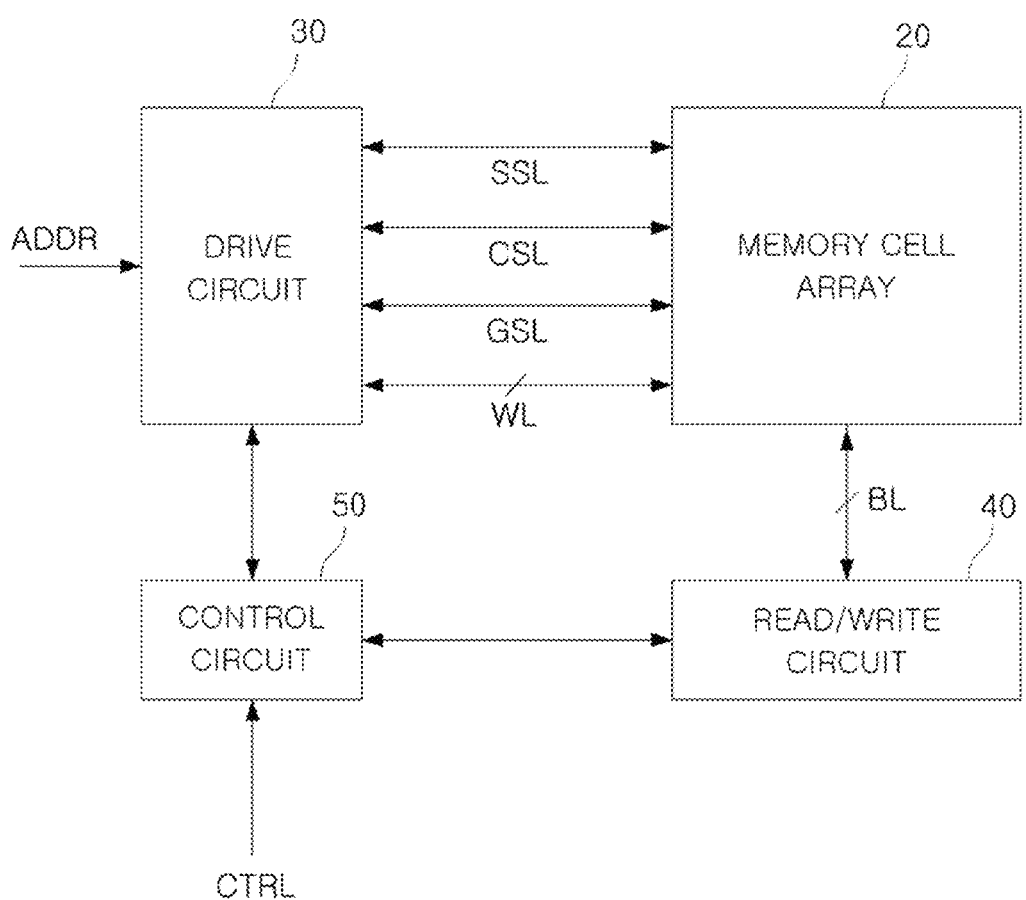
FIG. 1 is a schematic block diagram of a semiconductor device according to some example embodiments of present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Hereinafter, the term "dummy" is used herein to indicate a component having a structure and a shape that is the same as, or similar to, those of other components but which is merely present as a pattern without possessing the ability to perform substantial functions. Therefore, an electrical signal may not be applied to a "dummy" component and the "dummy" component may not be able to perform certain electrical functions even in the case that an electrical signal is applied thereto.

FIG. 1 is a schematic block diagram of a semiconductor device according to some example embodiments of present inventive concepts.

Referring to FIG. 1, a semiconductor device 10 according to some example embodiments of present inventive concepts may include a memory cell array 20, a driving (e.g., drive) circuit 30, a read/write circuit 40, and a control circuit 50.

The memory cell array 20 may include a plurality of memory cells, and the plurality of memory cells may be arranged in a plurality of rows and columns. The plurality of memory cells of the memory cell array 20 may be connected to the driving circuit 30 through word lines WL, common source lines CSL, string select lines SSL, ground select lines GSL, and the like and may be connected to the read/write circuit 40 through bit lines BL. In some example embodiments of present inventive concepts, a plurality of memory cells arranged in the same row may be connected to the same word line WL, and a plurality of memory cells arranged in the same column may be connected the same bit line BL.

The plurality of memory cells of the memory cell array 20 may be classified as a plurality of memory blocks. Each memory block may include a plurality of word lines WL, a plurality of string select lines SSL, a plurality of ground select lines GSL, a plurality of bit lines BL, and at least one common source line CSL.

The driving circuit 30 and the read/write circuit 40 may be operated by the control circuit 50. By way of example, the driving circuit 30 may receive address information ADDR from an external source and decode the received address information ADDR to select at least a portion of the word lines WL, the common source lines CSL, the string select lines SSL and the ground select lines GSL connected to the memory cell array 20. The driving circuit 30 may include driving circuit units for the respective word lines WL, the string select lines SSL, and the common source lines CSL.

The read/write circuit 40 may select at least a portion of the bit lines BL connected to the memory cell array 20 in response to a command received from the control circuit 50. The read/write circuit 40 may read data stored in the memory cell connected to the selected at least a portion of the bit lines BL or write data to the memory cell connected to the selected at least a portion of the bit lines BL. The read/write circuit 40 may include circuits such as a page buffer, an input/output buffer, a data latch, and the like, in order to perform the operations as described above.

The control circuit 50 may control operations of the driving circuit 30 and the read/write circuit 40 in response to a control signal CTRL transferred from an external source. In the case that data stored in the memory cell array 20 is read, the control circuit 50 may control an operation of the driving circuit 30 to supply a reading operation voltage to the word line WL in which data to be read is stored. When the reading operation voltage is supplied to a certain word line WL, the control circuit 50 may control the read/write circuit 40 to read data stored in the memory cell connected to the word line WL to which the reading operation voltage is supplied.

Meanwhile, in the case that data is written to the memory cell array 20, the control circuit 50 may control an operation of the driving circuit 30 to supply a writing operation voltage to the word line WL by which data is to be written. When the writing operation voltage is supplied to the certain word line WL, the control circuit 50 may control the read/write circuit 40 to write data to the memory cell connected to the word line WL by which the writing operation voltage is supplied.

Figure 2:
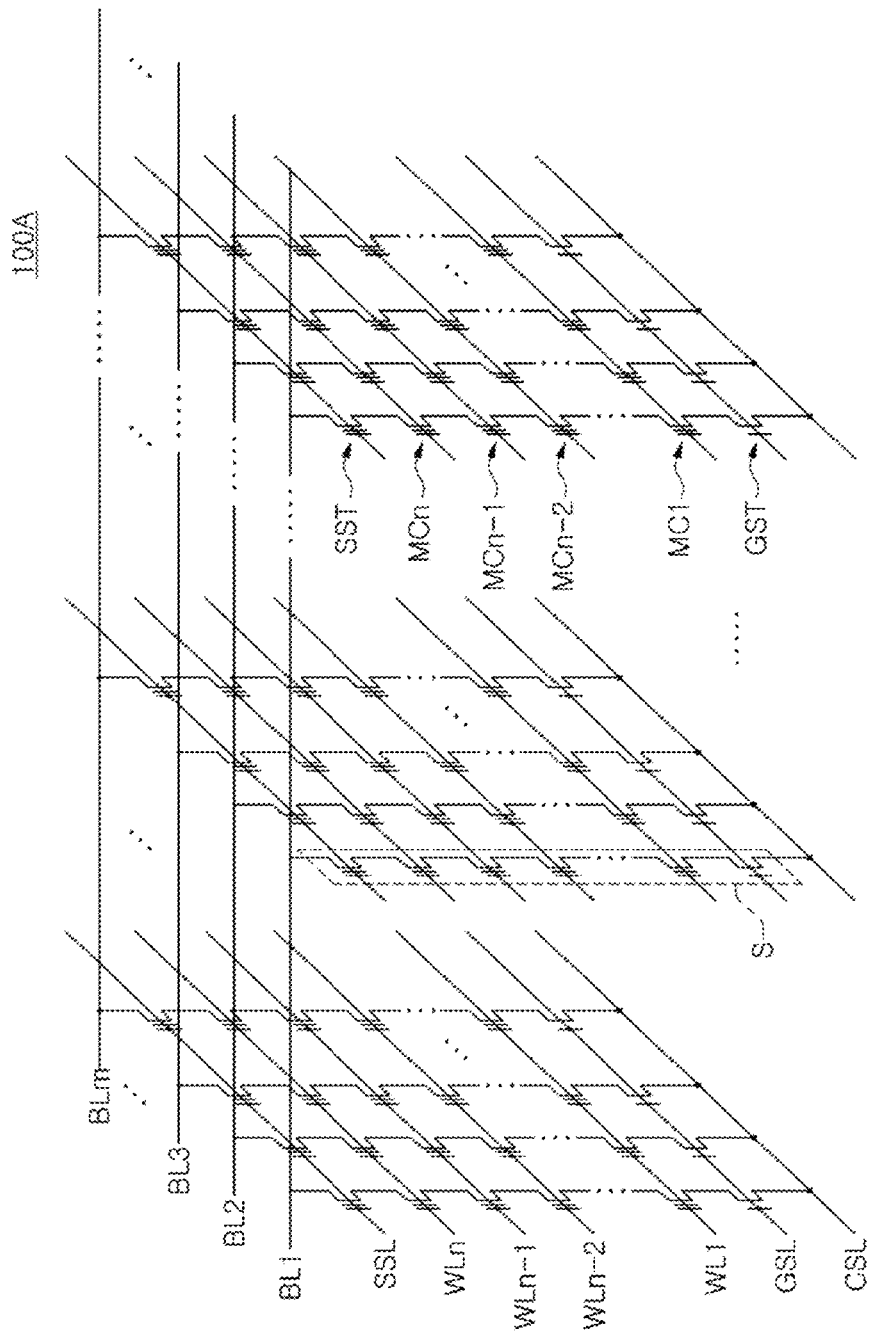
FIG. 2 is an equivalent circuit diagram of a memory cell array in a semiconductor device according to some example embodiments of present inventive concepts.

FIG. 2 is an equivalent circuit diagram of a memory cell array in the semiconductor device according to some example embodiments of present inventive concepts.

FIG. 2 is an equivalent circuit diagram illustrating a three-dimensional structure of the memory cell array included in a semiconductor device 100A having a vertical structure. Referring to FIG. 2, the memory cell array according to the example embodiment may include a plurality of memory cell strings S including n-number of memory cell elements MC1 to MCn connected in series, and a ground select transistor GST and a string select transistor SST connected to both terminals of the memory cell elements MC1 to MCn in series.

The n-number of memory cell elements MC1 to MCn, connected in series, may be connected to the word lines WL1 to WLn to select at least a portion of the memory cell elements MC1 to MCn, respectively.

A gate terminal of the ground select transistor GST may be connected to the ground select line GSL and a source terminal thereof may be connected to the common source line CSL. Meanwhile, a gate terminal of the string select transistor SST may be connected to the string select line SSL and a source thereof may be connected to a drain terminal of the memory cell element MCn. FIG. 2 illustrates a structure in which a single ground select transistor GST and a single string select transistor SST are connected to the n-number of memory cell elements MC1 to MCn connected in series. In some embodiments, however, a plurality of ground select transistors GST or a plurality of string select transistors SST may be connected to the n-number of memory cell elements MC1 to MCn connected in series.

A drain terminal of the string select transistor SST may be connected to bit lines BL1 to BLm. When a signal is applied to the gate terminal of the string select transistor SST through the string select line SSL, a signal applied through the bit lines BL1 to BLm may be transferred to the n-number of memory cell elements MC1 to MCn connected in series, whereby a data reading or writing operation may be performed. Further, when a signal is applied to a gate terminal of a gate select transistor GST having a source terminal thereof connected to the common source line CSL, through a gate select line GSL, an erase operation of removing all charges stored in the n-number of memory cell elements MC1 to MCn may be carried out.

Figure 3:
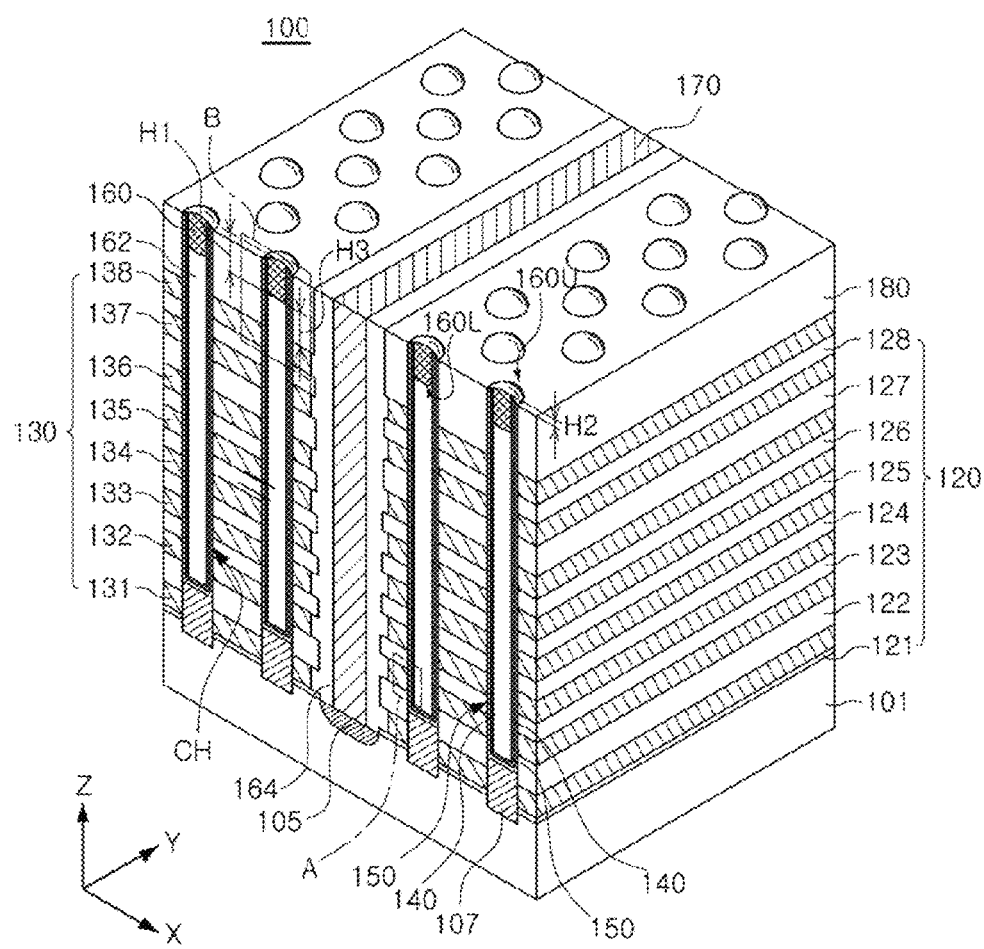
FIG. 3 is a schematic plan view of a semiconductor device according to some example embodiments of present inventive concepts.

FIG. 3 is a schematic perspective view illustrating a structure of memory cell strings of the semiconductor device according to some example embodiments of present inventive concepts.

Referring to FIG. 3, a semiconductor device 100 may include a substrate 101, channel holes CH extended in a direction perpendicular to an upper surface of the substrate 101 and having channel regions 140 (e.g., regions including a channel material) disposed therein, and a plurality of interlayer insulating layers 120 and a plurality of gate electrodes 130 that are stacked along outer sidewalls of the channel regions 140. The semiconductor device 100 may further include a gate dielectric layer 150 disposed between the gate electrodes 130 and each of the channel regions 140, epitaxial layers 107 disposed on lower portions of the channel regions 140, channel pads 160 disposed on upper portions of the channel holes CH, an impurity region 105 in the substrate 101 between the channel holes CH, and a conductive layer 170 provided on the impurity region 105. In FIG. 3, some components such as upper wiring structures, for example, bit lines BL1 to BLm (refer to FIG. 2), are omitted for simplicity of description/illustration. Moreover, the channel holes CH may optionally be referred to herein as respective channel recesses.

In the semiconductor device 100, a single memory cell string may be configured based on each channel region 140, and a plurality of memory cell strings may be arranged in rows and columns in an x-direction and a y-direction, respectively.

The upper surface of the substrate 101 may extend in the x-direction and the y-direction. The substrate 101 may include a semiconductor material, for example, a group IV semiconductor, a group III-V compound semiconductor, or a group II-VI oxide semiconductor. For example, the group IV semiconductor may include silicon, germanium, or silicon-germanium. The substrate 101 may be provided as a bulk wafer or an epitaxial layer.

The channel holes CH may be disposed to be spaced apart from each other while forming rows and columns on the substrate 101 and may be arranged to be separated from each other in the y-direction. That is, the channel holes CH may be disposed to form a lattice pattern or may be disposed in a zigzag manner (e.g., in the x-y plane of FIG. 3). The channel holes CH may have inclined side surfaces that narrow in a direction toward the substrate 101 in accordance with an increase in an aspect ratio thereof. However, the channel holes CH may be formed in various manners according to example embodiments and are not limited to the form illustrated in FIG. 3.

The channel regions 140 having pillar shapes may be disposed within the channel holes CH extended in the direction perpendicular to the upper surface of the substrate 101. Within the channel holes CH, the channel regions 140 may be formed to have annular shapes to encompass channel insulating layers 162 inside the channel regions 140, but are not limited thereto. The channel regions 140 may have pillar shapes such as prismatic shapes or cylindrical shapes in which the channel insulating layers 162 are not present. A portion of the channel regions 140 may be dummy channel regions. The channel regions 140 may be connected to the substrate 101 through the epitaxial layers 107 in lower ends thereof. The channel regions 140 may include a semiconductor material such as polycrystalline silicon or single crystalline silicon, and the semiconductor material may be an undoped material or a material containing p-type or n-type impurities.

The plurality of gate electrodes 130 (131 to 138) may be disposed on side walls of each of the channel regions 140 while being spaced apart from each other in the direction perpendicular to the substrate 101. Referring to FIG. 2, the respective gate electrodes 130 may form the ground select transistor GST, the plurality of memory cell elements MC1 to MCn, and a gate of the string select transistor SST. The gate electrodes 130 may form the word lines WL1 to WLn and may be connected to each other in common in a predetermined unit of adjacent memory cell strings arranged in the x-direction and the y-direction. In some example embodiments, a total of five gate electrodes 132 to 136 of the memory cell elements MC1 to MCn may be arranged, but the total number of gate electrodes 130 is not limited thereto. The number of the gate electrodes 130 forming the memory cell elements MC1 to MCn may be determined depending (e.g., based) on a degree of integration of the semiconductor device 100. For example, the number of the gate electrodes 130 forming the memory cell elements MC1 to MCn may be $2^n$ (where n is a natural number).

The gate electrode 131 of the ground select transistor GST may extend in the y-direction to form the ground select line GSL. For functions of the ground select transistor GST, a predetermined amount of an impurity may be doped within the substrate 101 disposed below the gate electrode 131.

The gate electrodes 137 and 138 of the string select transistor SST may extend in the y-direction to form the string select line SSL. In embodiments where the gate electrodes 137 and 138 of the string select transistor SST are disposed in a straight line in the x-direction, adjacent memory cell strings thereof may be connected to different bit lines BL1 and BLm (see FIG. 2) by a separate wiring structure. In some example embodiments, the gate electrodes 137 and 138 of the string select transistor SST may be separated from each other to form different string select lines SSL between the memory cell strings adjacent to each other in the x-direction. In some example embodiments, the gate electrodes 137 and 138 of the string select transistor SST may be singularly provided, and the gate electrode 131 of the ground select transistor GST may be singularly provided. Alternatively, two or more gate electrodes 137 and 138 of the string select transistor SST and two or more gate electrodes 131 of the ground select transistor GST may be provided. The gate electrodes 137 and 138 of the string select transistor SST and the gate electrode 131 of the ground select transistor GST may have structures identical to or different from those of the gate electrodes 132 to 136 of the memory cell elements MC1 to MCn.

Some of the gate electrodes 130, for example, the gate electrode(s) 130 adjacent to the gate electrode 131 of the ground select transistor GST, or the gate electrodes 137 and 138 of the string select transistor SST, may be dummy gate electrodes. For example, the gate electrode 132 adjacent to the gate electrode 131 of the ground select transistor GST may be a dummy gate electrode.

The gate electrodes 130 may include polycrystalline silicon or a metal silicide material. The metal silicide material may be a silicide material of a metal selected from among, for example, cobalt (Co), nickel (Ni), hafnium (Hf), platinum (Pt), tungsten (W), and titanium (Ti), or combinations thereof. In some example embodiments, the gate electrodes 130 may include a metallic material, for example, tungsten (W). Moreover, in some embodiments, the gate electrodes 130 may further include diffusion barriers. The diffusion barriers may include, for example, tungsten nitride (WN), tantalum nitride (TaN), titanium nitride (TiN), or combinations thereof.

The plurality of interlayer insulating layers 120 (121 to 128) may be arranged between the gate electrodes 130. The interlayer insulating layers 120 may be spaced apart from each other in the z-direction and may extend in the y-direction, in a similar manner to the gate electrodes 130. The interlayer insulating layers 120 may include an insulating material such as a silicon oxide or a silicon nitride.

A first insulating layer 180 may be disposed on an uppermost portion of the gate electrodes 130. The first insulating layer 180 may include an insulating material such as a silicon oxide or a silicon nitride, similar to the interlayer insulating layers 120.

Each of the channel pads 160 may be disposed to cover an upper surface of the channel insulating layer 162 and be electrically connected to the channel region 140, at the top of the memory cell strings. The channel pad 160 may include, for example, doped polycrystalline silicon. The channel pad 160 may serve as a drain region of the string select transistor SST (see FIG. 2) and may be electrically connected to the bit lines BL1 to BLm (see FIG. 2) by a connection structure such as a conductive contact plug.

The channel pads 160 may have upper surfaces 160U and lower surfaces 160L curved/bent in different directions. The channel pads 160 may have convex upper surfaces 160U. In particular, the upper surface 160U of each channel pad 160 may have a convex shape in an upward direction that is a direction away from the substrate 101. The shape of the upper surface 160U of the channel pad 160 may also be referred to herein as a dome shape or a concave downward shape. At least a portion of the upper surface 160U of the channel pad 160 may protrude from (e.g., protrude upward in the z-direction beyond a top surface of) the first insulating layer 180. Due to such a shape, the channel pad 160 may be stably connected to the top wiring structure.

On the other hand, the lower surfaces 160L of the channel pads 160 may be convex toward the substrate 101. Therefore, the channel pads 160 may have a first height H1, a maximum height, in a central portion thereof and may have a thickness reduced toward an edge thereof. The first height H1 may range from about 600 Å to about 1200 Å. The channel pads 160 may protrude from the first insulating layer 180 by a second height H2 at the central portions thereof. The second height H2 may range from about 1 angstrom (Å) to about 100 Å and may be modified according to a size of the channel holes CH. The channel pads 160 may be positioned to be spaced apart from the uppermost gate electrode 138 by a third height H3. The third height H3 may range from about 600 Å to about 1200 Å and may be greater than the first height H1 but is not limited thereto.

Side surfaces of the channel pads 160 may contact the channel regions 140. Although FIG. 3 illustrates embodiments in which the channel regions 140 and the gate dielectric layers 150 are on the side surfaces of the channel pads 160, the present disclosure is not limited thereto. For example, in some example embodiments, only the channel regions 140 are disposed, or neither the channel regions 140 nor the gate dielectric layer 150 are disposed, on the side surfaces of the channel pads 160. Accordingly, the channel pads 160 may extend to sidewalls of the channel holes CH and may come into contact with the first insulating layer 180.

The channel pads 160 may include, for example, doped polycrystalline silicon. The channel pads 160 may contain a p-type or n-type impurity.

The gate dielectric layer 150 may be disposed between the gate electrodes 130 and the channel region 140 within the channel hole CH. The gate dielectric layer 150 may extend vertically (e.g., in the z-direction) along the channel region 140 on the substrate 101. The gate dielectric layer 150 may include a tunneling layer, a charge storing layer, and a blocking layer that are sequentially stacked from the channel region 140. In connection with this, a description will be provided in more detail with reference to FIG. 4A through FIG. 4C.

The epitaxial layers 107 may be disposed on the substrate 101 in the lower ends of the channel holes CH and may be disposed on a side surface of at least one gate electrode 130. The epitaxial layers 107 may be disposed in recessed regions of the substrate 101. Upper surfaces of the epitaxial layers 107 may be higher than an upper surface of the lowest gate electrode 131 and may be lower than a lower surface of the gate electrode 132 disposed above the gate electrode 131. Even in a case in which an aspect ratio of the channel regions 140 is increased, the channel regions 140 may be stably electrically connected to the substrate 101 by the epitaxial layers 107, and characteristics of the ground select transistor GST between memory cell strings may be uniformized. Alternatively, in some example embodiments, the epitaxial layers 107 may be omitted and the channel regions 140 may be directly connected to the substrate 101.

The epitaxial layers 107 may be formed using a selective epitaxial growth (SEG) process. The epitaxial layers 107 may be formed of a single layer or a plurality of layers. The epitaxial layers 107 may include polycrystalline silicon, single crystalline silicon, polycrystalline germanium, or single crystalline germanium doped with, or not doped with, an impurity. For example, when the substrate 101 is formed of single crystalline silicon (Si), the epitaxial layers 107 may be formed of single crystalline silicon. In some example embodiments, even when the substrate 101 is formed of single crystalline silicon (Si), at least a portion of the epitaxial layers 107 may have a polycrystalline silicon structure including a plurality of grains.

The conductive layer 170 may penetrate through the gate electrodes 130 and the interlayer insulating layers 120 between the channel regions 140 to be connected to the substrate 101, and may be electrically insulated from the gate electrodes 130 by a filling insulating layer 164. Therefore, the gate electrodes 130 may be separated from each other in the x-direction with the conductive layer 170 interposed therebetween. The conductive layer 170 may be disposed in a linear manner extended in the y-direction. For example, the respective conductive layers 170 may be arranged between two columns to four columns of the channel regions 140 on a one by one basis, at a predetermined distance, in the x-direction, but present inventive concepts are not limited thereto. The conductive layer 170 may have a width reduced toward the substrate 101 due to a high aspect ratio, but is not limited thereto.

The impurity region 105 may be disposed in the substrate 101, adjacent a lower portion of the conductive layer 170. The impurity region 105 may be adjacent to the upper surface of the substrate 101 and may extend in the y-direction. The impurity region 105 may contain an impurity that is the same as (or, alternatively, opposite to) that of the substrate 101. In a case in which the impurity region 105 may contain an impurity that is the same as that of the substrate 101, the impurity region 105 may contain the impurity at a concentration higher than that of the substrate 101. The conductive layer 170 may apply a voltage to the substrate 101 through the impurity region 105.

Figure 4A:
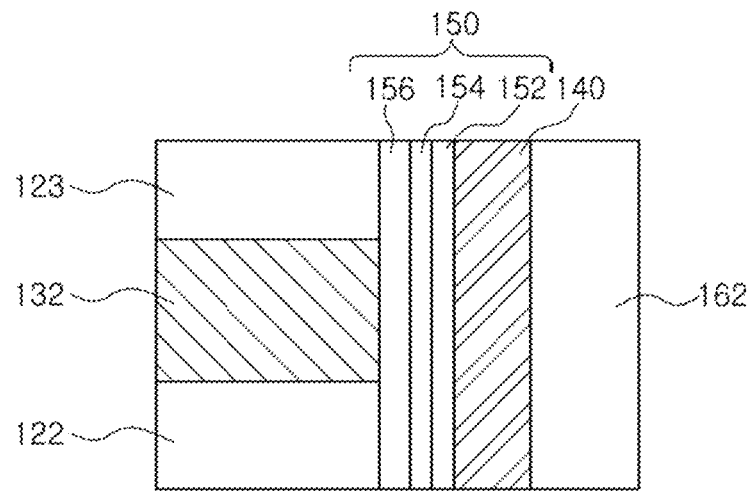
FIGS. 4A through 4C are respective cross-sectional views illustrating a gate dielectric layer according to some example embodiments of present inventive concepts.
Figure 4B:
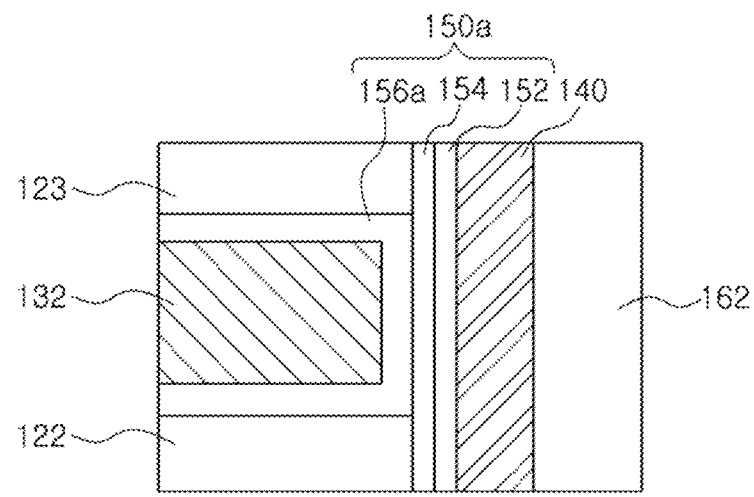
Figure 4C:
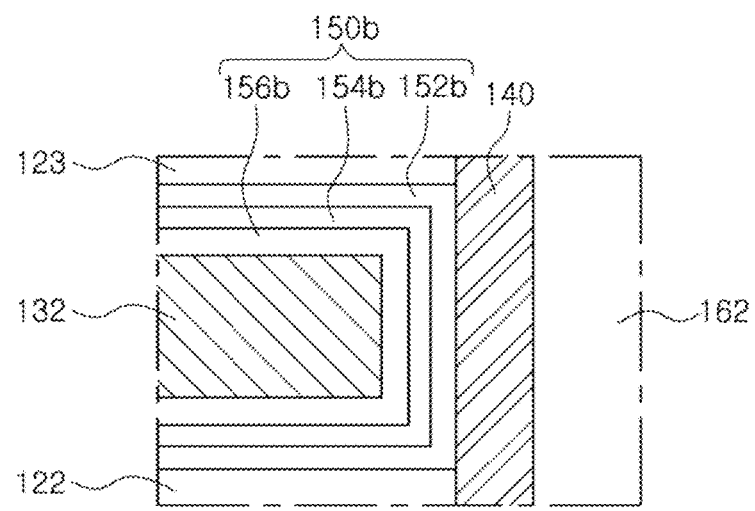

FIGS. 4A through 4C are respective cross-sectional views illustrating a gate dielectric layer according to some example embodiments of present inventive concepts. FIGS. 4A through 4C each illustrate a region that corresponds to region 'A' of FIG. 3.

Referring to FIG. 4A, the gate electrode 132, the gate dielectric layer 150, and the channel region 140 of the memory cell strings are illustrated. The gate dielectric layer 150 may include a tunneling layer 152, a charge storing (e.g., storage) layer 154, and a blocking layer 156 that are sequentially stacked from (e.g., adjacent/along) the channel region 140.

The tunneling layer 152 may tunnel charges to the charge storing layer 154, using Fowler-Nordheim (F-N) tunneling. The tunneling layer 152 may include silicon dioxide ($SiO_2$), silicon nitride ($Si_3N_4$), silicon oxynitride (SiON), or combinations thereof.

The charge storing layer 154 may be a charge trapping layer or a floating gate conductive layer. For example, the charge storing layer 154 may include a dielectric material, quantum dots, or nanocrystals. Here, the quantum dots or the nanocrystals may be configured of fine particles, for example, fine metal or semiconductor particles. In some example embodiments, when the charge storing layer 154 is a charge trapping layer, the charge storing layer 154 may be formed of a silicon nitride.

The blocking layer 156 may include silicon dioxide ($SiO_2$), silicon nitride ($Si_3N_4$), silicon oxynitride (SiON), a high-k dielectric material, or combinations thereof. The high-k dielectric material may include at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

Referring to FIG. 4B, the gate electrode 132, a gate dielectric layer 150a, and the channel region 140 of the memory cell strings are illustrated according to some embodiments. The gate dielectric layer 150a may have a structure having the tunneling layer 152, the charge storing layer 154, and a blocking layer 156a sequentially stacked from the channel region 140. Relative thicknesses of the layers forming the gate dielectric layer 150a are not limited to those illustrated in the drawings and may be changed in various ways.

In comparison with the gate dielectric layer 150 of FIG. 4A, the gate dielectric layer 150a according to some example embodiments of FIG. 4B may be disposed such that the tunneling layer 152 and the charge storing layer 154 may extend in a vertical direction (e.g., the z-direction of FIG. 3) along the channel region 140, while the blocking layer 156a may extend along a plurality of sides (e.g., three sides) of the gate electrode 132. In some example embodiments, a portion of the blocking layer 156a may extend vertically along the channel region 140, and remaining portions of the blocking layer 156a may be disposed to encompass (e.g., to extend in the x-direction along top and bottom surfaces of) the gate electrode 132.

Referring to FIG. 4C, the gate electrode 132, a gate dielectric layer 150b, and the channel region 140 of the memory cell strings are illustrated. The gate dielectric layer 150b may have a structure having a tunneling layer 152b, a charge storing (e.g., storage) layer 154b, and a blocking layer 156b sequentially stacked from the channel region 140.

In particular, unlike the structures of FIG. 4A and FIG. 4B, the gate dielectric layer 150b according to some example embodiments of FIG. 4C may be disposed such that all of the tunneling layer 152b, the charge storing layer 154b, and the blocking layer 156b may encompass (e.g., cover three sides of) the gate electrode 132.

Figure 5A:
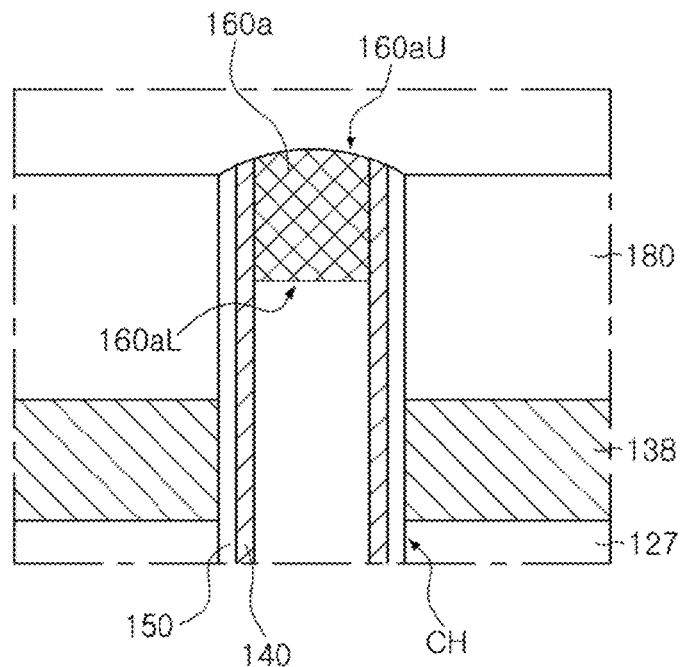
FIGS. 5A through 5C are respective cross-sectional views illustrating a channel pad according to some example embodiments of present inventive concepts.
Figure 5B:
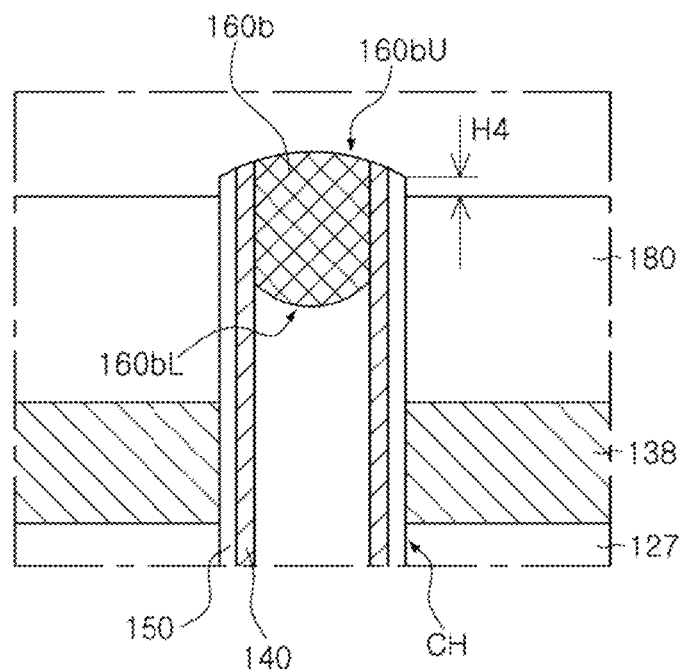
Figure 5C:
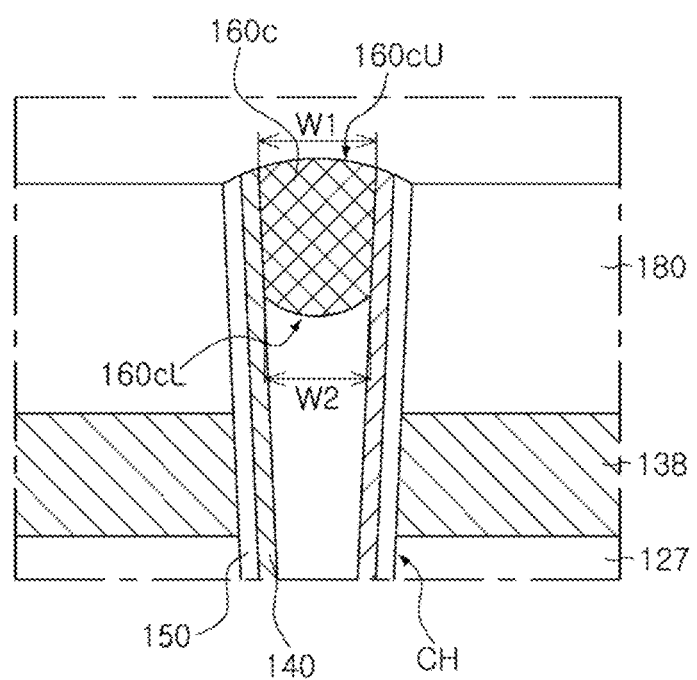

FIGS. 5A through 5C are respective cross-sectional views illustrating a channel pad according to some example embodiments of present inventive concepts. FIGS. 5A through 5C each illustrate a region corresponding to region 'B' of FIG. 3.

Referring to FIG. 5A, the channel region 140, the gate dielectric layer 150, and a channel pad 160a in the channel hole CH are illustrated. The channel pad 160a may have an upwardly convex upper surface 160aU.

In comparison with the channel pad 16Q of FIG. 3, the channel pad 160a according to some embodiments of FIG. 5A may have a flat lower surface 160aL. Such a shape of the lower surface 160aL of the channel pad 160a may be modified according to a manufacturing method.

Referring to FIG. 5B, the channel region 140, the gate dielectric layer 150, and a channel pad 160b in the channel hole CH are illustrated. The channel pad 160b may have an upwardly convex upper surface 160bU and a downwardly convex lower surface 160bL.

In comparison with the layers/elements in the channel hole CH of FIG. 3, in the case of the channel pad 160b according to some embodiments of FIG. 5B, the entirety of the layers/elements in the channel hole CH may protrude upwardly from the first insulating layer 180. In other words, the channel region 140 and the gate dielectric layer 150 on a side surface of the channel pad 160b, together with the channel pad 160b itself, may protrude from (e.g., protrude upward past the top surface of) the first insulating layer 180. The gate dielectric layer 150 may protrude from the first insulating layer 180 by a fourth height H4. The fourth height H4 may range, for example, from several angstroms (Å) to several tens of angstroms (Å).

Referring to FIG. 5C, the channel region 140, the gate dielectric layer 150, and a channel pad 160c in the channel hole CH are illustrated. The channel pad 160c may have an upwardly convex upper surface 160cU and a downwardly convex lower surface 160cL.

In comparison with the channel pad 160 that is illustrated in FIG. 3, in the case of the channel pad 160c according to some embodiments of FIG. 5C, a width W2 of the lower surface 160cL may be smaller than a width W1 of the upper surface 160cU. The reason for this is that the channel hole CH is formed to have a width reduced (e.g., a width that decreases) in a downward direction (e.g., downward in the z-direction) toward the substrate 101. When the channel hole CH has a high aspect ratio, it may be formed to have a width reduced in a downward direction depending on (e.g., due to) a formation process thereof and, accordingly, in the case of the channel pad 160c filling the top portion of the channel hole CH, the upper surface 160cU and the lower surface 160cL may have different widths.

Figure 6:
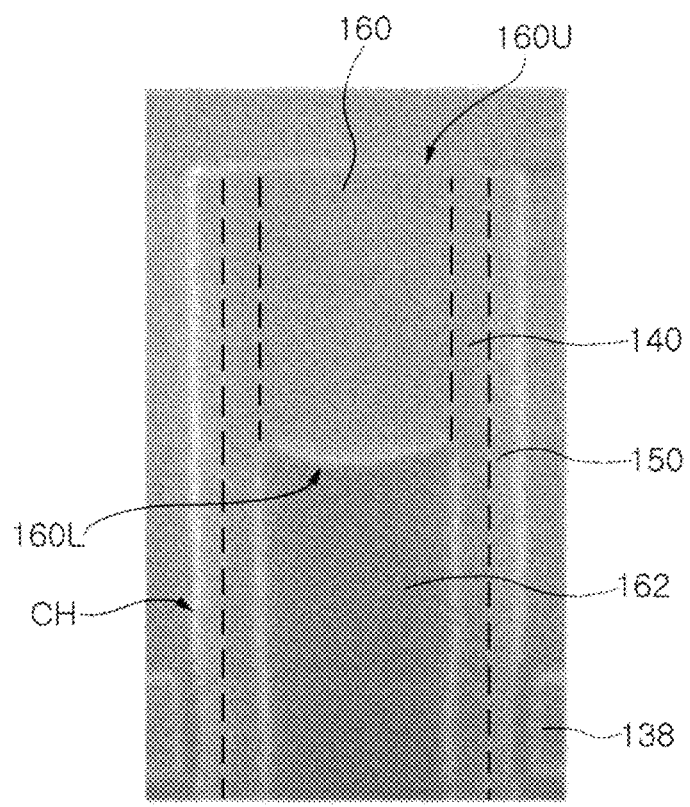
FIG. 6 is an image obtained by a scanning electron microscope (SEM) illustrating the channel pad according to some example embodiments of present inventive concepts.

FIG. 6 is an image obtained by a scanning electron microscope (SEM) illustrating a channel pad 160 according to some example embodiments of present inventive concepts.

Referring to FIG. 6, the gate dielectric layer 150 and the channel region 140 may be sequentially disposed on/from a sidewall in/of the channel hole CH. The channel insulating layer 162 may fill a lower portion of the channel hole CH, and the channel pad 160 may be disposed on the channel insulating layer 162 in the top portion of the channel hole CH.

The channel pad 160 may have an upwardly convex upper surface 160U, and a degree of convexity may be modified variously in some embodiments. The channel pad 160 may have a downwardly convex lower surface 160L. The channel region 140 and the channel pad 160 may be formed of the same material and, in this case, as shown in FIG. 6, a boundary therebetween may not be readily apparent on the image as viewed with the naked eye.

Similar to embodiments according to FIG. 4B, a portion of the gate dielectric layer 150 may be disposed between the gate electrode 138 and the channel hole CH in some embodiments according to FIG. 6.

FIGS. 7A through 7J are schematic views of respective main processes, illustrating a method of manufacturing the semiconductor device according to some example embodiments of present inventive concepts. In FIGS. 7A through 7J, a method of manufacturing the semiconductor device 100 of FIG. 3 is explained.

Figure 7A:
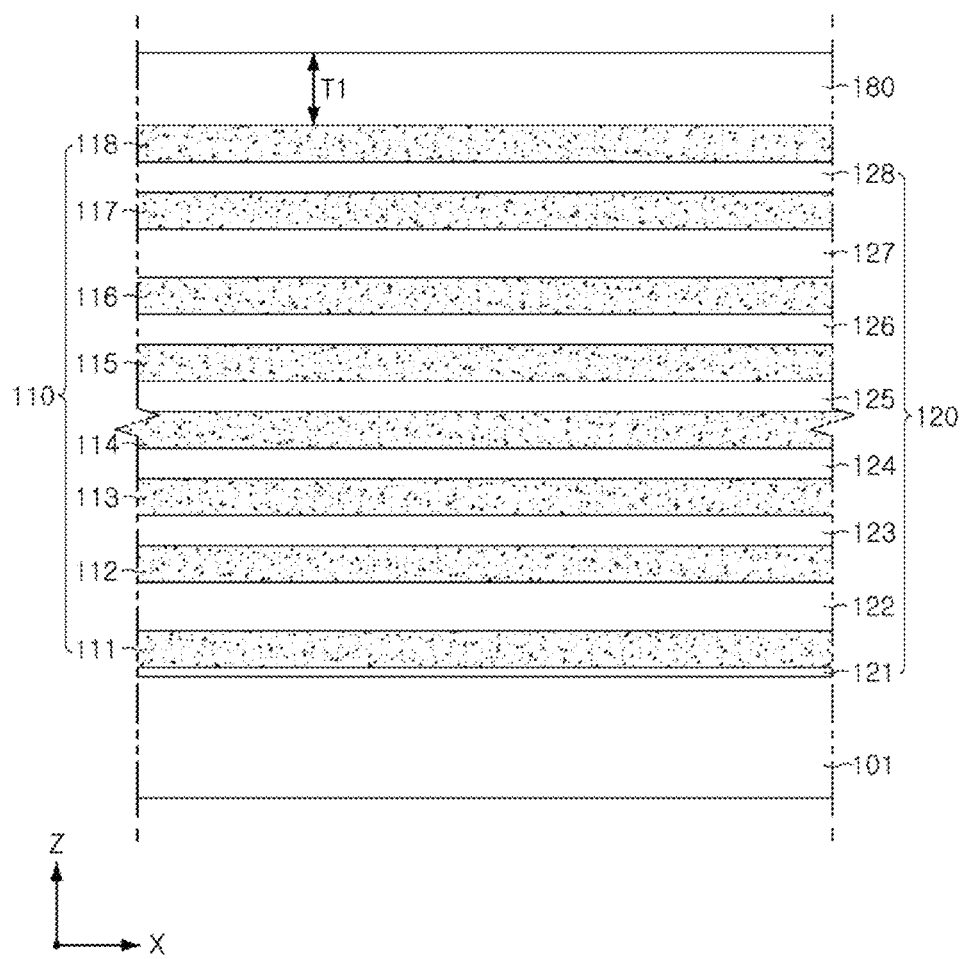
FIGS. 7A through 7J are schematic views of respective main processes, illustrating a method of manufacturing the semiconductor device according to some example embodiments of present inventive concepts.

Referring to FIG. 7A, sacrificial layers 111 to 118 (110) and the interlayer insulating layers 121 to 128 (120) may be alternately stacked on the substrate 101. After performing the alternate stacking, the first insulating layer 180 may be formed on an uppermost portion of a stacked structure of the sacrificial layers 111 to 118 (110) and the interlayer insulating layers 121 to 128 (120). Through a subsequent process, the sacrificial layers 110 may be replaced with the gate electrodes 130 that are illustrated in FIG. 3.

First, the interlayer insulating layer 121 may be formed, and as illustrated in FIG. 7A, the sacrificial layers 110 and the interlayer insulating layers 120 may be alternately stacked on the substrate 101 to form the stacked structure. The sacrificial layers 110 may be formed of a material having etch selectivity with respect to the interlayer insulating layers 120. That is, the sacrificial layers 110 may be formed of a material capable of being etched while significantly limiting/decreasing the etching of the interlayer insulating layers 120 during a process of etching the sacrificial layers 110. Such an etch selectivity or an etch selection ratio may be quantitatively represented by a ratio of an etch rate of the sacrificial layers 110 to an etch rate of the interlayer insulating layers 120. For example, the interlayer insulating layer 120 may be formed of at least one of a silicon oxide layer and silicon nitride, and the sacrificial layer 110 may be formed of a material different from that of the interlayer insulating layer 120 and selected from a group consisting of silicon, silicon oxide, silicon carbide, and silicon nitride.

In some example embodiments, thicknesses of the interlayer insulating layers 120 may not be the same as each other. For example, the lowermost interlayer insulating layer 121 of the interlayer insulating layers 120 may be relatively thinly formed. In some example embodiments, the interlayer insulating layers 122 and 126 disposed between the ground select transistor GST and the string select transistor SST, and the memory cell elements MC1 to MCn illustrated in FIG. 2 may be relatively thicker than the interlayer insulating layers 123 to 125 disposed between the memory cell elements MC1 to MCn. The thicknesses of the interlayer insulating layers 120 and the sacrificial layers 110 may be variously modified from those illustrated, and the number of layers configuring (e.g., included among) the interlayer insulating layers 120 and the sacrificial layers 110 may also be variously modified.

The first insulating layer 180 formed on the uppermost portion of the stacked structure may include regions for the formation of the channel pads 160 (e.g., the channel pads illustrated in FIG. 3 or FIGS. 5A-5C) and may be formed to have a thickness T1 relatively greater than those of the interlayer insulating layers 120. The thickness T1 may range from 1.5 times to 2.5 times the thickness (in the z-direction) of the channel pad 160. For example, the thickness T1 may range from about 1000 Å to about 2200 Å. As an example, the thickness T1 may range from about 1500 Å to about 2000 Å. In contrast, when the thickness of the first insulating layer 180 is greater than about 2200 Å, the amount of the first insulating layer 180 that must be removed during a subsequent planarization process may increase, thereby leading to the occurrence of dishing in the channel pads 160. On the other hand, when the thickness of the first insulating layer 180 is smaller than about 1000 Å, a distance between a top surface of the first insulating layer 180 and the uppermost gate electrode 138 that is formed in a subsequent process (after removing the sacrificial layer 118) may be reduced to a level that may cause defects.

The first insulating layer 180 may be, for example, a tetraethyl ortho silicate (TEOS) oxide.

Figure 7B:
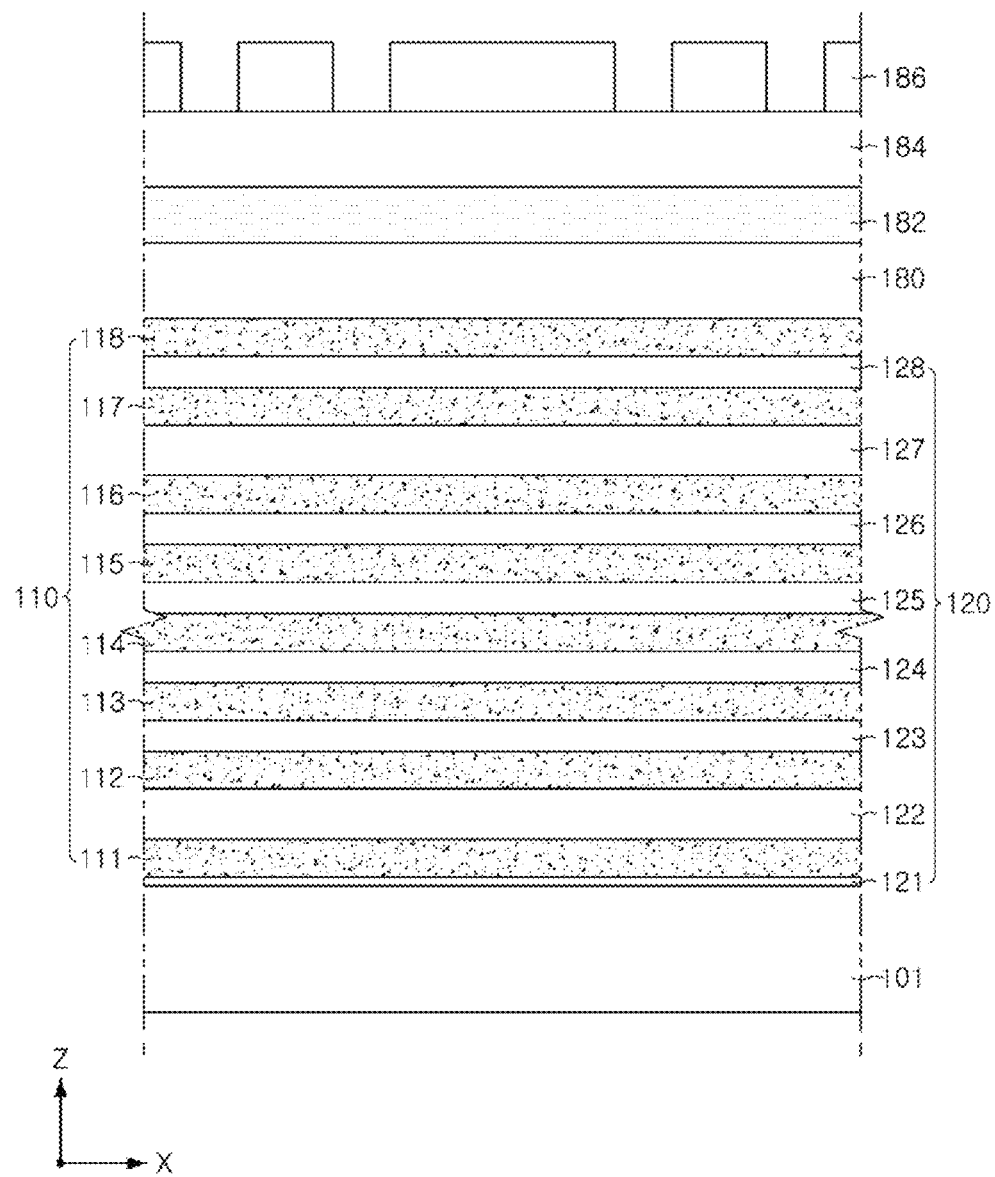

Referring to FIG. 7B, first to third mask layers 182, 184, and 186 may be formed on the interlayer insulating layers 120, the sacrificial layers 110, and the first insulating layer 180 that are stacked on one another.

The first and second mask layers 182 and 184 may be formed of different materials, and may thus have an etch selectivity with respect to each other. The second mask layer 184 may be formed of the same material as the interlayer insulating layers 120. For example, the first mask layer 182 may be formed of a silicon nitride and the second mask layer 184 may be formed of a silicon oxide such as TEOS.

The third mask layer 186 may be, for example, a photoresist layer, and may be patterned to have open regions corresponding to subsequently-formed channel holes (e.g., the channel holes CH that are illustrated in FIG. 3).

Figure 7C:
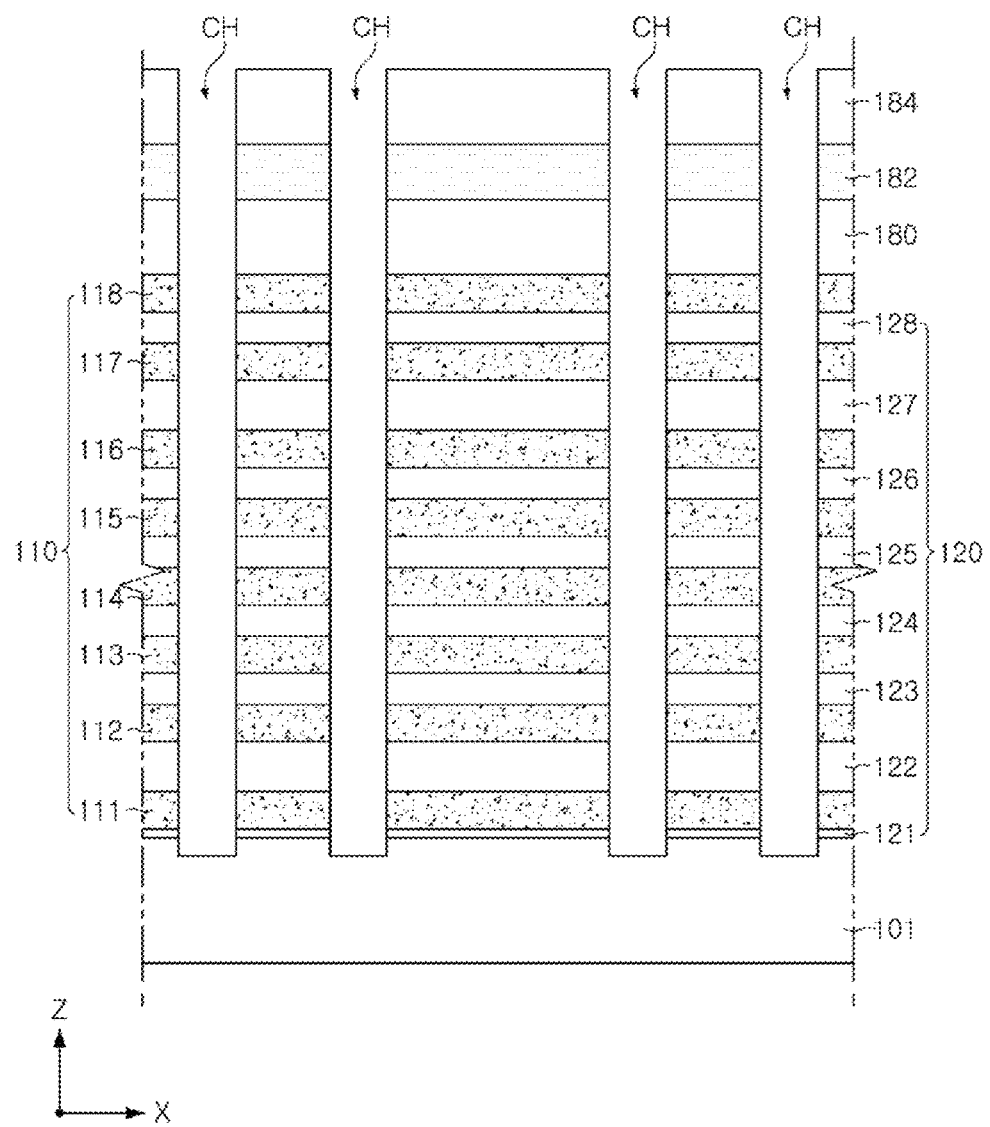

Referring to FIG. 7C, the channel holes CH may be formed using the third mask layer 186.

The channel holes CH may be formed by anisotropically etching the first and second mask layers 182 and 184, the first insulating layer 180, the sacrificial layers 110, and the interlayer insulating layers 120. During the etching, the second mask layer 184 may function as a hard mask layer. Although portions of the substrate 101 may optionally be recessed by forming the channel holes CH, present inventive concepts are not limited thereto.

Because the channel holes CH are formed by etching the stacked structure that includes different types of layers, the sidewalls of the channel holes CH may not be perpendicular to the upper surface of the substrate 101 in some example embodiments. For example, in some example embodiments, widths of the channel holes CH may be reduced (e.g., may narrow when moving downward in the z-direction) toward the upper surface of the substrate 101.

Figure 7D:
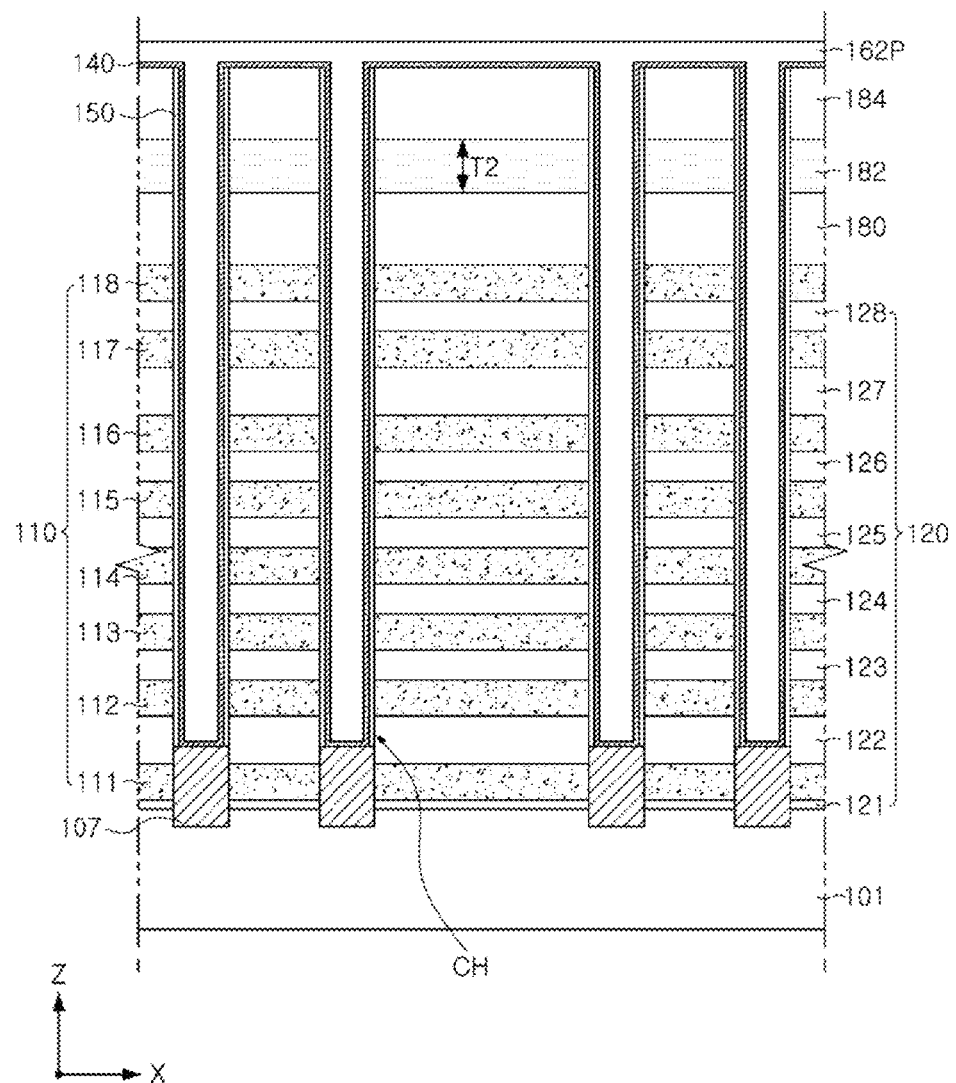

Referring to FIG. 7D, the epitaxial layers 107, the gate dielectric layers 150, the channel regions 140, and a preliminary channel insulating layer 162P may be formed within the channel holes CH.

First, the epitaxial layers 107 may be formed on the recessed regions of the substrate 101. The epitaxial layers 107 may be grown from the substrate 101 using a selective epitaxial growth (SEG) process. The epitaxial layers 107 may be formed of a single layer or a plurality of layers. The epitaxial layers 107 may include polycrystalline silicon, single crystalline silicon, polycrystalline germanium, or single crystalline germanium doped with (or not doped with) an impurity. Upper surfaces of the epitaxial layers 107 may be disposed at a position higher than that of the upper surface of the sacrificial layer 111 that is to be replaced by the gate electrode 131 of a ground select transistor (e.g., the ground select transistor GST that is illustrated in FIG. 2).

Next, the gate dielectric layers 150 may be respectively formed to have a uniform thickness by an atomic layer deposition (ALD) process or a chemical vapor deposition (CVD) process. In the process, the entirety (or, alternatively, only a portion) of the gate dielectric layer 150 may be formed, and a portion of the gate dielectric layer 150 extended to be perpendicular to the substrate 101 along each channel hole CH may be formed in the process. The channel region 140 may be formed on the gate dielectric layer 150 within each of the channel holes CH.

The preliminary channel insulating layer 162P may be formed to fill the channel holes CH and may be formed of an insulating material. However, in some example embodiments, a space between opposing sidewalls of the channel regions 140 may be filled with a conductive material, rather than the preliminary channel insulating layer 162P. The preliminary channel insulating layer 162P may fill the channel holes CH and may be formed even on the second mask layer 184.

Figure 7E:
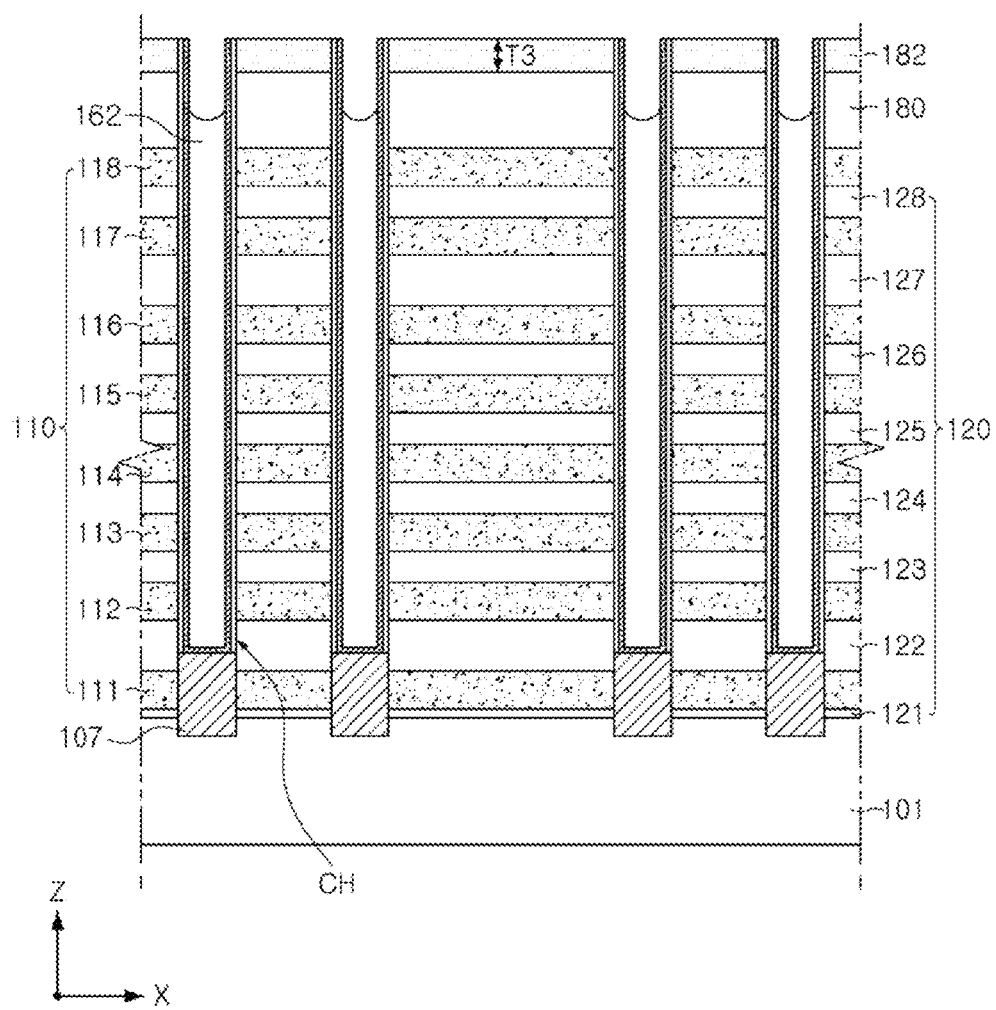

Referring to FIG. 7E, the channel insulating layers 162 may be formed by removing portions of the preliminary channel insulating layer 162P in the upper portions of the channel holes CH.

First, the material of the preliminary channel insulating layer 162P formed in the upper portions of the channel holes CH may be removed by performing a planarization process such as a chemical mechanical polishing (CMP) process using the first mask layer 182 as an etch-stop layer, and a flat upper surface of the stacked structure may be formed, whereby the second mask layer 184 may be removed. However, this process is selectively provided and thus, may optionally be omitted.

Then, the preliminary channel insulating layer 162P may be partially removed from the channel holes CH using an etch-back process. The upper surfaces of the channel insulating layers 162 formed through this process may be positioned within (e.g., at heights/levels in the channel holes CH that are between adjacent portions of) the first insulating layer 180, and may have a shape that extends/points downward toward the substrate 101 (which shape may also be referred to as a concave upward shape). In some example embodiments, when the preliminary channel insulating layer 162P is partially removed, at least a portion of the channel region 140 and/or the gate dielectric layer 150 disposed on an upper side surface of a channel hole CH may be removed simultaneously with the preliminary channel insulating layer 162P. During the planarization process and/or etch-back process, the first mask layer 182 may also be partially removed, and may thus have a thickness T3 that is smaller than a thickness T2 in a previous process (e.g., the process in FIG. 7D).

Figure 7F:
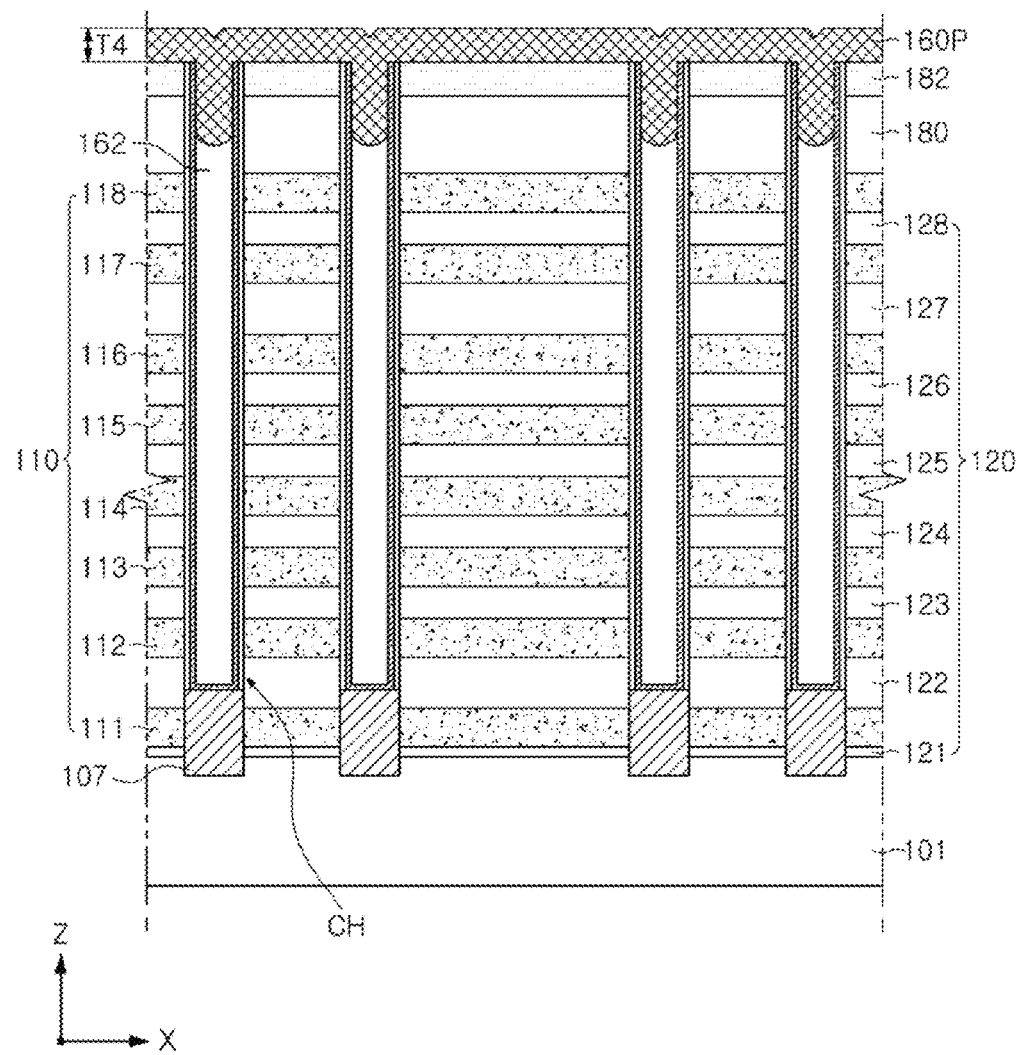

Referring to FIG. 7F, a channel pad layer 160P may be formed on the channel insulating layers 162 that were formed in FIG. 7D. The channel pad layer 160P may be provided on the channel insulating layers 162 to fill the channel holes CH by depositing a conductive material, and may extend upwardly beyond the stacked structure. The channel pad layer 160P may be formed to have a predetermined thickness T4 on the upper surface of the first mask layer 182. The thickness T4 may be determined as a minimum thickness capable of stably filling all of the plurality of channel holes CH.

In the process of FIG. 7F, a depth to which the channel pad layer 160P is formed in the channel holes CH may be adjusted, whereby the channel pad layer 160P may be formed so as not to include defects such as voids. A formation depth of the channel pad layer 160P may be determined depending on thicknesses of the first insulating layer 180 and the first mask layer 182 and a target thickness of the channel pads 160. In some example embodiments, the thickness of the first insulating layer 180 may be adjusted to control the depth of the channel pad layer 160P, as described above with reference to FIG. 7A.

Figure 7G:
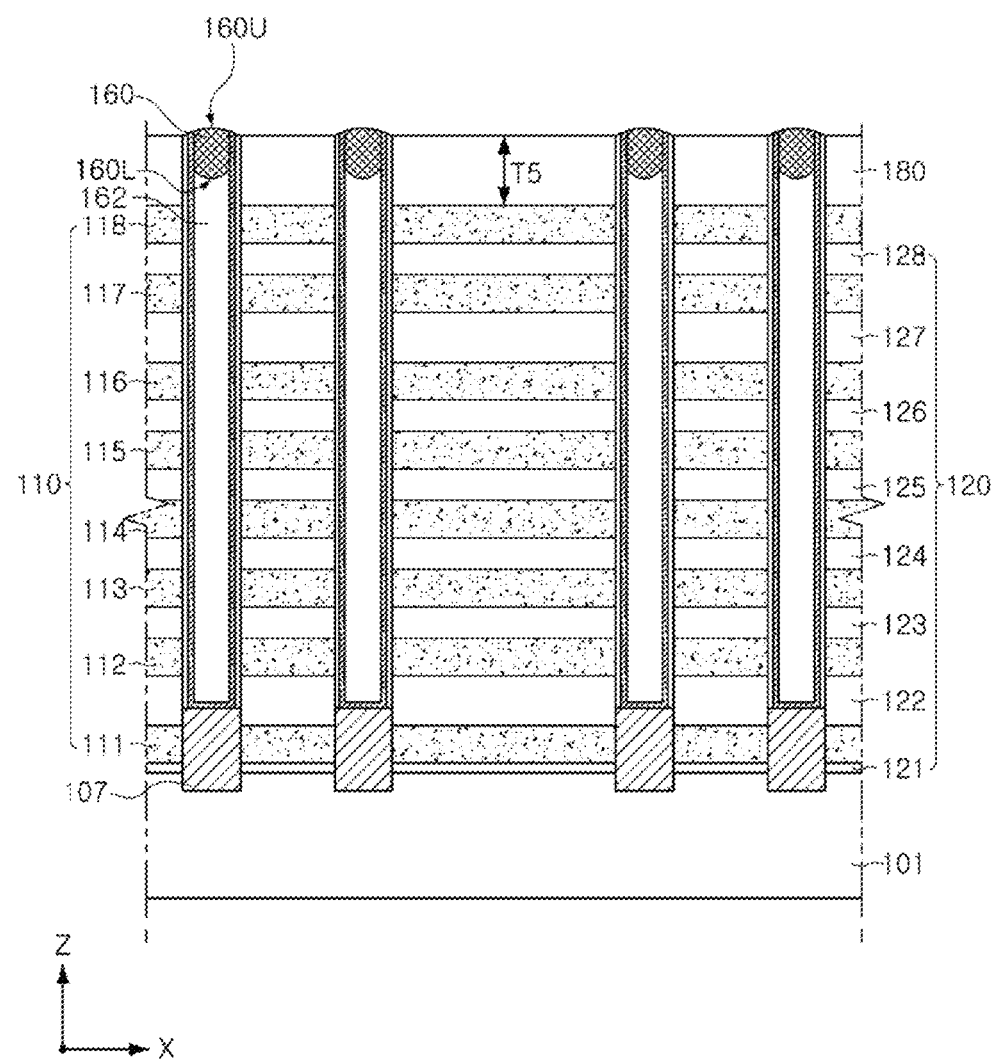

Referring to FIG. 7G, the channel pad layer 160P may be partially removed in such a manner that it primarily/only remains in the channel holes CH, thus forming the channel pads 160.

First, the portions of the channel pad layer 160P that are on top of the first mask layer 182 may be removed by performing a planarization process such as CMP using the first mask layer 182 as an etch-stop layer.

Next, the first mask layer 182 may be removed, along with portions of the channel pad layer 160P that are between adjacent portions of the first mask layer 182, by performing a planarization process such as CMP using the first insulating layer 180 as an etch-stop layer. In this case, because the planarization process may be primarily/mainly performed as a condition for removing the first mask layer 182, the channel pad layer 160P may not be relatively smoothly removed, and the upper surfaces 160U of the channel pads 160 may thus be upwardly convexly formed. Because only small/minimal (if any) portions of the first insulating layer 180 may be removed, the occurrence of dishing in the channel pads 160 may be reduced/prevented. The lower surfaces 160L of the channel pads 160 may be downwardly convexly formed due to concave upward shapes of the channel insulating layers 162.

After the channel pads 160 are formed, a thickness T5 of the first insulating layer 180 may optionally be identical to the thickness T1 thereof when the first insulating layer 180 is initially formed (e.g., as illustrated in FIG. 7A). Alternatively, a small amount of the first insulating layer 180 may be removed in the process of FIG. 7G, and the thickness of the first insulating layer 180 may thus be slightly reduced. The thickness T5 may range from about 1.5 times to about 2.5 times (e.g., about 1.5 times to about 2 times) the thicknesses of the channel pads 160.

Figure 7H:
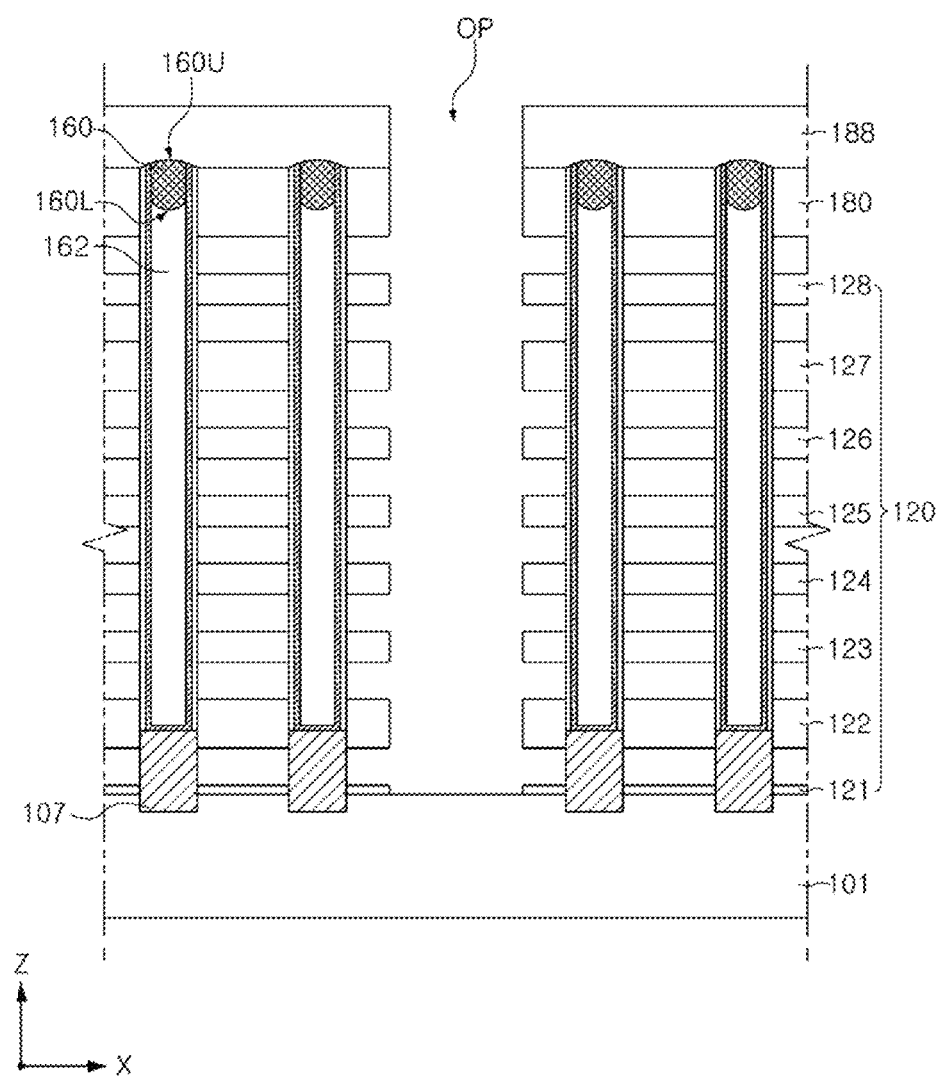

Referring to FIG. 7H, after forming a second insulating layer 188 on the channel pads 160, an opening OP separating the sacrificial layers 110 and the interlayer insulating layers 120 by a predetermined distance may be formed, and the sacrificial layers 110 exposed through the opening OP may be removed.

The second insulating layer 188 may reduce/prevent damage to the channel pads 160 and the channel regions 140 disposed therebelow. An interface of the first and second insulating layers 180 and 188 may be formed at edges of the gate dielectric layers 150 and the channel regions 140 that are adjacent to the upper surfaces 160U of the channel pads 160.

The opening OP may be formed by forming a mask layer using a photolithography process and then anisotropically etching the stacked structure of the sacrificial layers 110 and the interlayer insulating layers 120. The opening OP may be formed as a trench that extends in the y-direction (i.e., the y-direction that is illustrated in FIG. 3). The opening OP may allow the substrate 101 to be exposed between the channel regions 140. The sacrificial layers 110 may be removed by an etching process, and a plurality of lateral openings may thus be formed between vertically-adjacent (in the z-direction) ones of the interlayer insulating layers 120. A sidewall of the gate dielectric layer 150 may be partially exposed through the lateral openings.

Figure 7I:
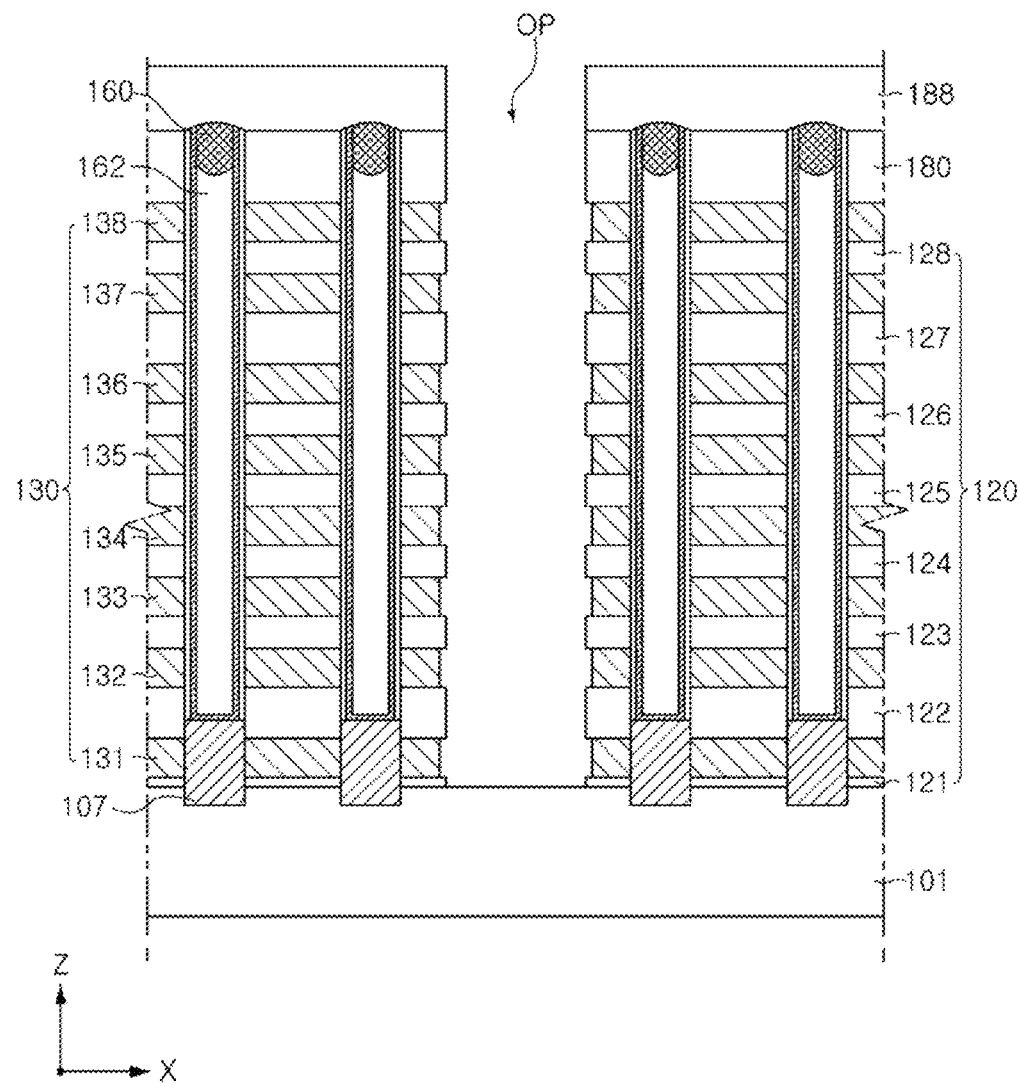

Referring to FIG. 7I, the gate electrodes 130 may be formed in the lateral openings that were formed in FIG. 7H by the removal of the sacrificial layers 110. The gate electrodes 130 may include a metal, polycrystalline silicon, or a metal silicide material. The metal silicide material may be a silicide material of a metal selected from among, for example, cobalt (Co), nickel (Ni), hafnium (Hf), platinum (Pt), tungsten (W), and titanium (Ti) or combinations thereof. When the gate electrodes 130 are formed of a metal silicide material, the gate electrodes 130 may be formed by, after filling the interior portions of the lateral openings with silicon (Si), forming a separate metal layer to perform a silicide process.

After the formation of the gate electrodes 130, a material of the gate electrodes 130 that extends into the opening OP may be removed through an additional process in such a manner that the gate electrodes 130 may be present only in the lateral openings.

Figure 7J:
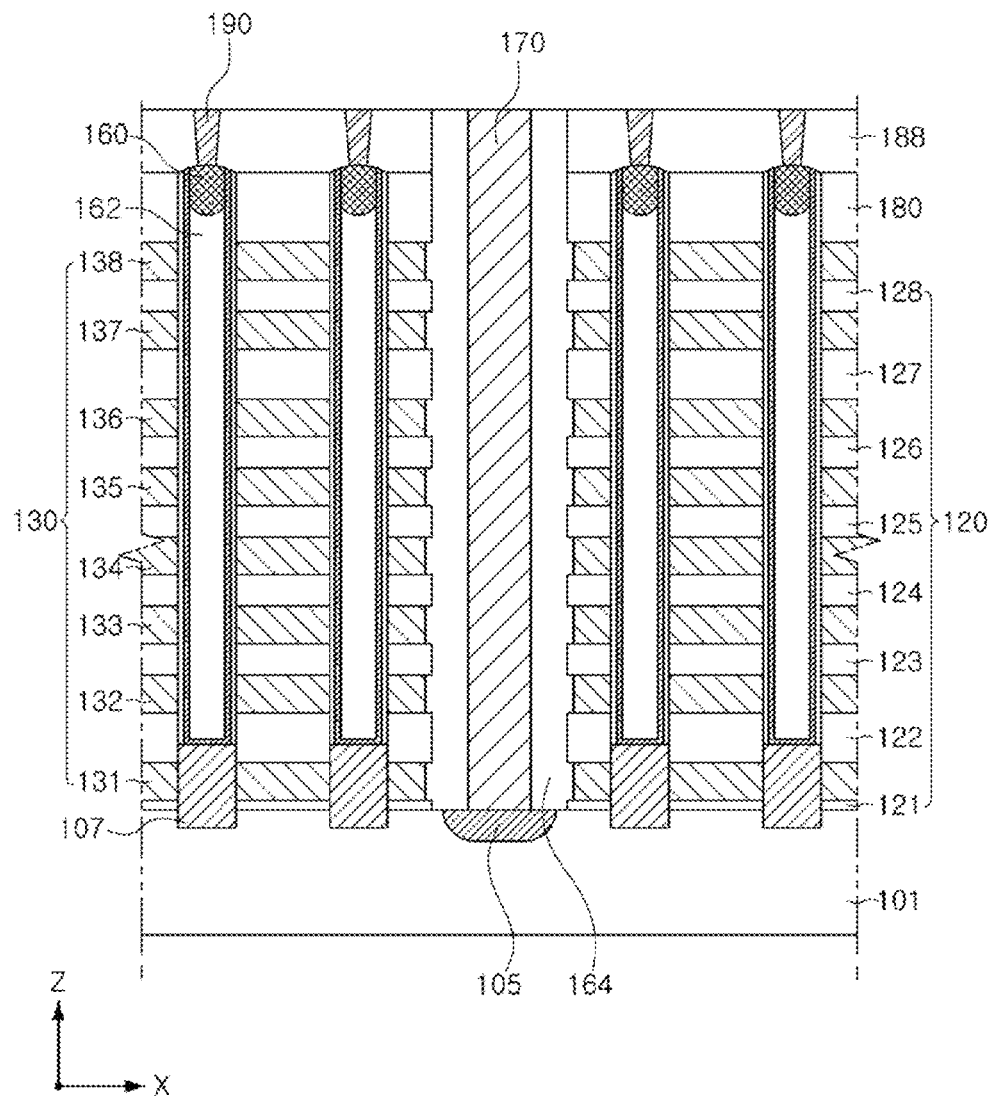

Referring to FIG. 7J, the impurity region 105 may be formed in a region of the substrate 101 that is exposed by the opening OP. Moreover, the filling insulating layer 164 and the conductive layer 170 may be formed on the impurity region 105.

First, an impurity may be introduced in an exposed portion of the substrate 101 that is exposed by the opening OP, to form the impurity region 105. Then, the filling insulating layer 164 may be formed on a sidewall of the opening OP. The filling insulating layer 164 may be fabricated in a spacer shape by forming an insulating material and removing the insulating material from the substrate 101 so as to expose the upper surface of the substrate 101. In some example embodiments, the impurity region 105 may also be formed after at least a portion of the filling insulating layer 164 is first formed. Moreover, in some example embodiments, the filling insulating layer 164 may be formed of multiple layers.

Next, the conductive layer 170 may be formed on a region defined by the filling insulating layer 164. Prior to the formation of the conductive layer 170, a diffusion barrier layer may be further formed on the filling insulating layer 164. The diffusion barrier layer may include, for example, a nitride such as titanium nitride (TiN) or tungsten nitride (WN).

Thereafter, contact holes penetrating through the second insulating layer 188 may be formed on the channel pads 160, and contact plugs 190 filling the contact holes may be formed. As illustrated in FIG. 7J, the channel pads 160 have upwardly convex upper surfaces to thereby reduce/prevent defects by which a portion of a plurality of contact plugs 190 may not be connected to the channel pads 160 when the plurality of contact plugs 190 are formed in the process of FIG. 7J. That is, due to the convex upper surfaces of the channel pads 160, a process margin during the formation of the contact holes may be secured to thereby impede/prevent a phenomenon in which the channel pads 160 are not exposed by the contact holes.

In some example embodiments, the contact plugs 190 may be formed to allow the channel pads 160 to be partially recessed. The contact plugs 190 may connect the channel pads 160 to wiring structures such as bit lines (e.g., the bit lines BL1 to BLm that are illustrated in FIG. 2).

The contact plugs 190 may include a conductive material, for example, a metal such as tungsten (W), aluminum (Al), or copper (Cu).

Figure 8:
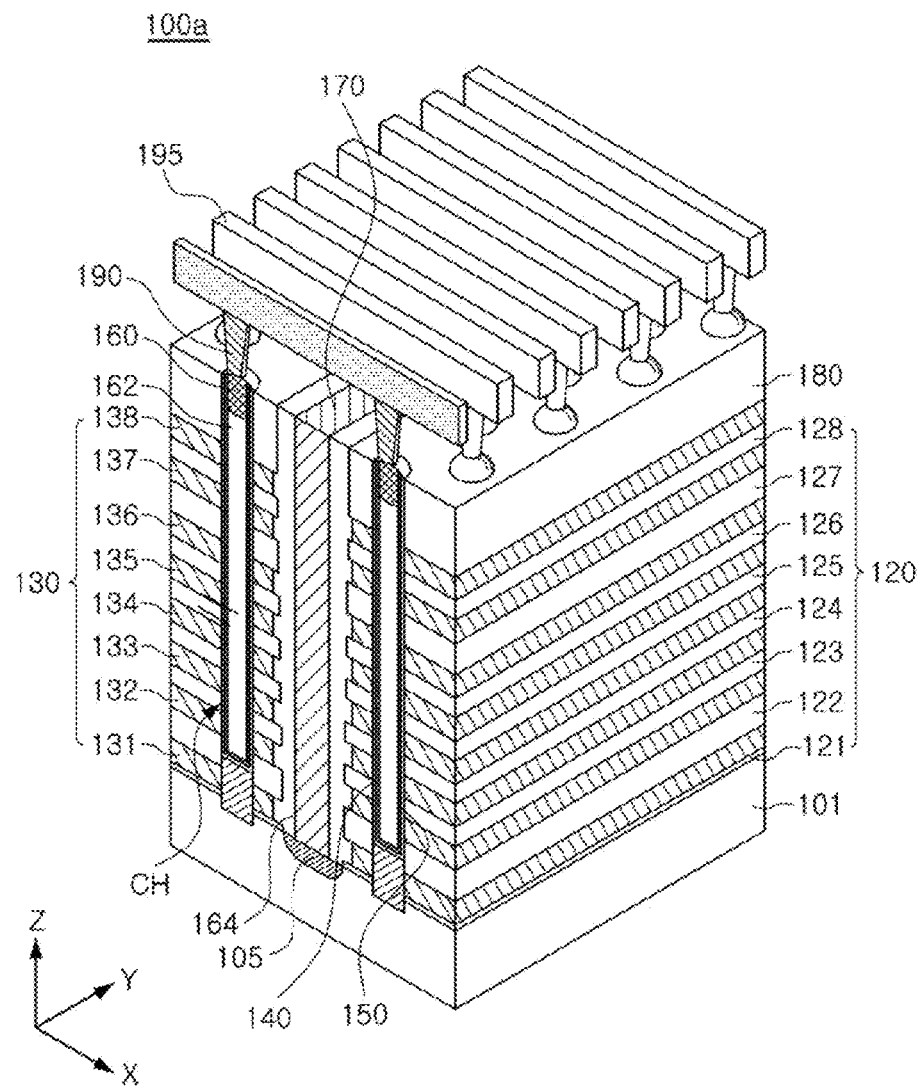
FIGS. 8 and 9 are schematic perspective views respectively illustrating a semiconductor device according to some example embodiments of present inventive concepts.
Figure 9:
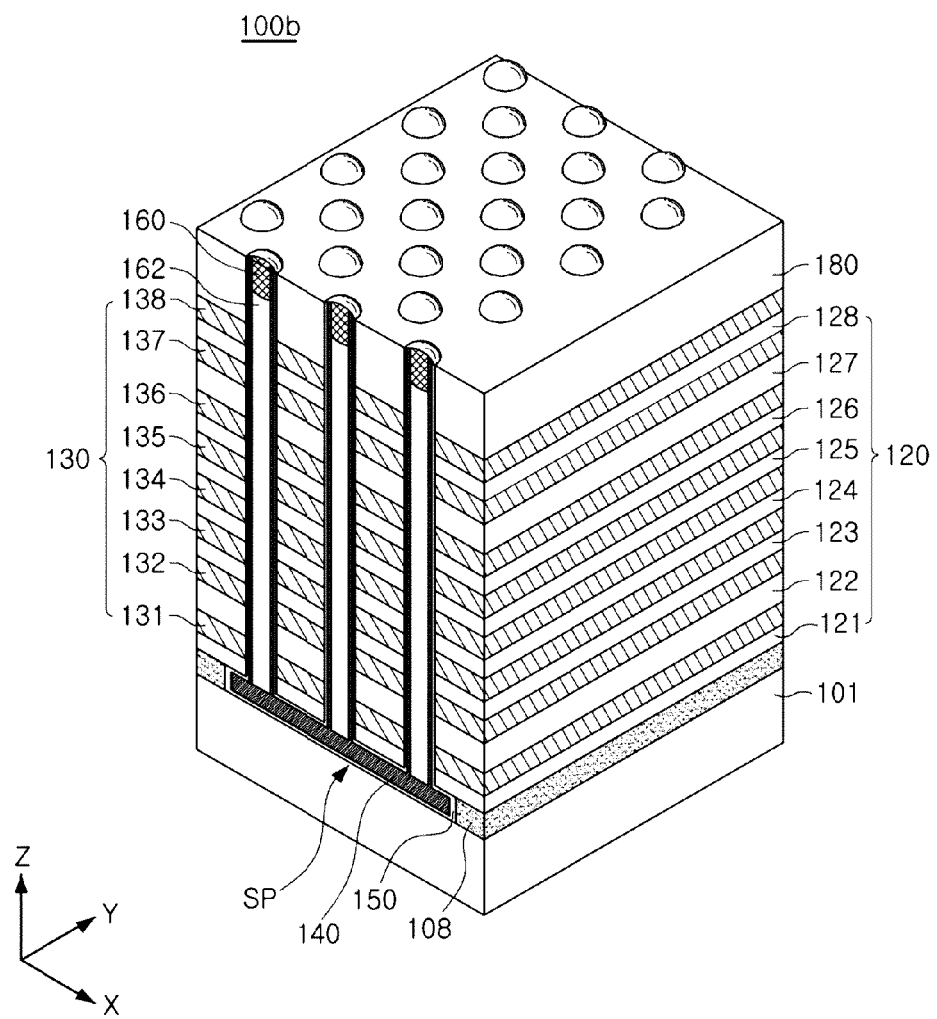

FIGS. 8 and 9 are schematic perspective views respectively illustrating a semiconductor device according to some example embodiments of present inventive concepts.

Referring to FIG. 8, a semiconductor device 100a may include the substrate 101, the channel holes CH having the channel regions 140 disposed therein, the plurality of interlayer insulating layers 120, the plurality of gate electrodes 130, the gate dielectric layer 150, the epitaxial layers 107, the channel pads 160, the impurity region 105, and the conductive layer 170. The semiconductor device 100a may further include the contact plugs 190 on the channel pads 160 and the bit lines 195.

The channel pads 160 may be electrically connected to the bit lines 195 through the contact plugs 190. The channel pads 160 in some embodiments according to FIG. 8 may have upwardly convex upper surfaces, and may thus be stably electrically connected to the contact plugs 190.

The contact plugs 190 may have widths that narrow in a downward direction, but are not limited thereto. In some example embodiments, the contact plugs 190 may be formed in such a manner that the upper portions of the channel pads 160 are recessed to a predetermined depth.

The bit lines 195 may extend in one direction (e.g., in the x-direction) on upper portions of the contact plugs 190. The bit lines 195 may be disposed in such a manner that ones of the channel pads 160 that are arranged in a straight line that extends in the x-direction within a single gate stack including gate electrodes 130 separated from an adjacent gate stack by conductive layers 170 may be connected to different bit lines 195. To this end, in some example embodiments, the bit lines 195 may have a structure in which they further include additional wiring lines and contact plugs positioned on upper and lower portions of the bit lines 195.

The contact plugs 190 and the bit lines 195 may include a conductive material, for example, a metal such as tungsten (W), aluminum (Al), or copper (Cu).

Referring to FIG. 9, a semiconductor device 100b may include the substrate 101, as well as the channel holes CH that have the channel region 140 disposed therein. The semiconductor device 100b may include the plurality of interlayer insulating layers 120 and the plurality of gate electrodes 130. Moreover, the semiconductor device 100b may include a horizontal portion SP disposed on the substrate 101 and including a region in which the channel region 140 is extended in a horizontal direction (e.g., the x-direction). The semiconductor device 100b may include a horizontal-filling layer 108 disposed on the outside of the horizontal portion SP, the gate dielectric layer 150, and the channel pads 160.

In particular, the semiconductor device 100b that is illustrated in FIG. 9 includes the horizontal portion SP disposed below the gate electrodes 130. In some example embodiments, the horizontal portion SP may be disposed in/within the substrate 101.

The horizontal portion SP may be connected to the channel holes CH, may be disposed in a layer parallel to the upper surface of the substrate 101, and may have a continuous structure between at least a subset of the channel holes CH.

The horizontal portion SP may have a continuous plate-shaped structure between at least a subset of the channel holes CH, and the number of the channel holes CH connected by the horizontal portion SP may be variously modified in some embodiments.

The horizontal portion SP may be defined by a portion of the gate dielectric layer 150 and the channel region 140. That is, the horizontal portion SP may be formed by horizontally extending the channel region 140 and the gate dielectric layer 150 from the channel holes CH. The gate dielectric layer 150 may be disposed on lower and side surfaces of the horizontal portion SP, and an interior portion of the horizontal portion SP may be filled with the channel region 140. However, the disposition of the gate dielectric layer 150 and the channel region 140 inside the horizontal portion SP is not limited thereto, and may be variously modified in some embodiments.

The horizontal-filling layer 108 may be disposed in parallel with the horizontal portion SP on the outside of the horizontal portion SP. That is, the horizontal-filling layer 108, together with the horizontal portion SP, may form a single layer parallel to the upper surface of the substrate 101. The horizontal-filling layer 108 may be formed of a conductive material, for example, a semiconductor material, but is not limited thereto. In some example embodiments, the horizontal-filling layer 108 may optionally be omitted and, in this case, the horizontal portion SP may extend into a region where the horizontal-filling layer 108 would otherwise be formed.

In some example embodiments, some of the channel pads 160 may be connected to the bit lines 195 (e.g., as illustrated in FIG. 8) disposed above the channel pads 160, and other ones of the channel pads 160 may be connected to wiring lines to which an electrical signal different from that of the bit lines 195 is applied.

Figure 10:
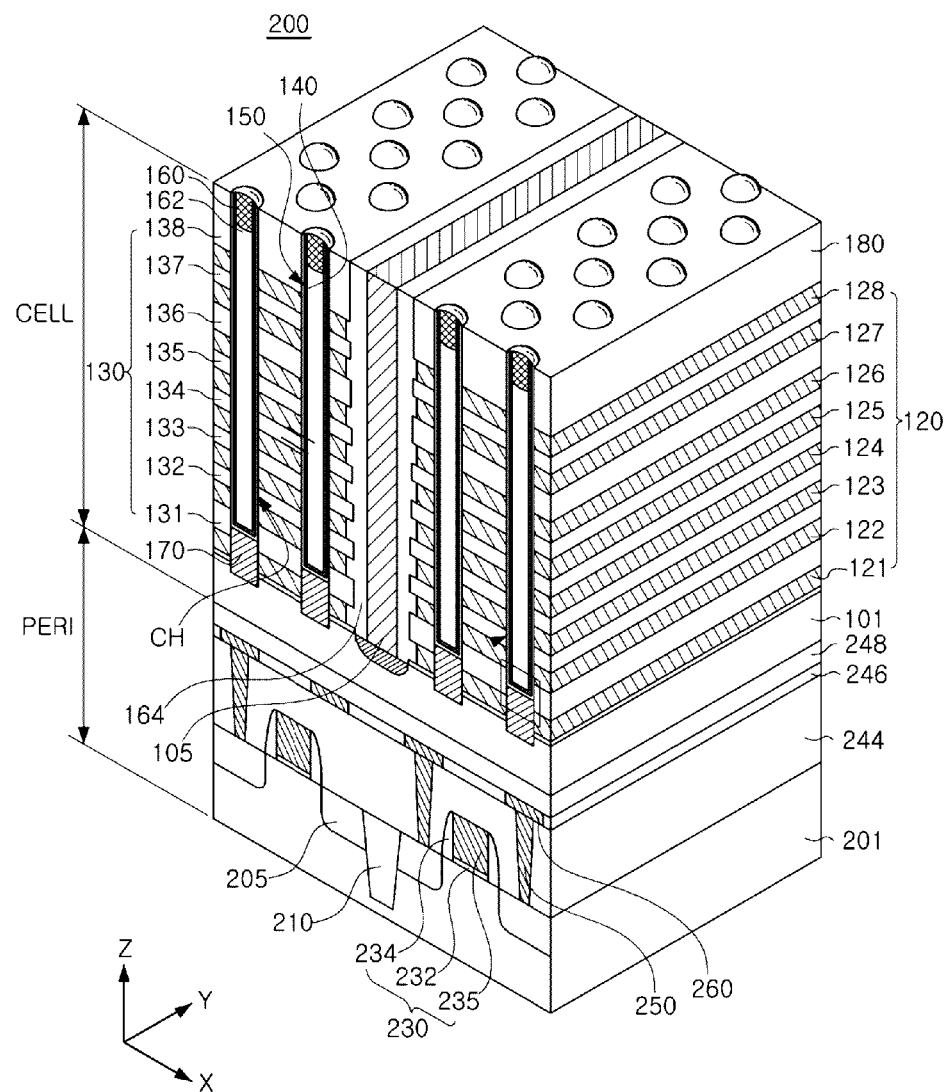
FIG. 10 is a schematic perspective view of a semiconductor device according to some example embodiments of present inventive concepts.

FIG. 10 is a schematic perspective view of a semiconductor device according to some example embodiments of present inventive concepts. Referring to FIG. 10, a semiconductor device 200 may include a cell region CELL and a peripheral circuit region PERI.

The cell region CELL may correspond to a region in which the memory cell array 20 of FIG. 1 is disposed, and the peripheral circuit region PERI may correspond to a region in which the drive circuit 30 of FIG. 1 is disposed. The cell region CELL may be disposed at a top end of the peripheral circuit region PERI. Alternatively, in some example embodiments, the cell region CELL may be disposed at a bottom end of the peripheral circuit region PERI.

The cell region CELL of the semiconductor device 200 may include the substrate 101, the channel holes CH extended in a direction perpendicular to the upper surface of the substrate 101 and having channel regions 140 disposed therein, and the plurality of interlayer insulating layers 120 and the plurality of gate electrodes 130 that are stacked along outer sidewalls of the channel holes CH. The cell region CELL of the semiconductor device 200 may further include the gate dielectric layer 150 disposed between the gate electrodes 130 and each of the channel regions 140, the epitaxial layers 107 disposed on lower portions of the channel regions 140, channel pads 160 disposed on upper portions of the channel holes CH, the impurity region 105 in the substrate 101 between the gate electrodes 130, and the conductive layer 170 provided on the impurity region 105.

In some example embodiments, although the cell region CELL is illustrated as having the same structure as the example embodiment of FIG. 3, it is not limited thereto. The cell region CELL may include, for example, the semiconductor devices according to various example embodiments described with reference to FIGS. 4A to 5C, FIG. 8 and FIG. 9.

The peripheral circuit region PERI may include a base substrate 201, circuit elements 230 disposed on the base substrate 201, contact plugs 250, and wiring lines 260.

The base substrate 201 may have an upper surface extended in an x-direction and a y-direction. The base substrate 201 may be provided with a device isolation layer 210 to define an active region. In a portion of the active region, a doping region 205 containing an impurity may be disposed. The base substrate 201 may include a semiconductor material, for example, a group IV semiconductor, a group III-V compound semiconductor, or a group II-VI oxide semiconductor.

The circuit elements 230 may include planar transistors. Each of the circuit elements 230 may include a circuit gate insulating layer 232, a spacer layer 234, and a circuit gate electrode 235. The doping region 205 may be disposed in a region of the base substrate 201 at sides of the circuit gate electrodes 235, thereby serving as a source region or a drain region of the circuit element 230.

A plurality of peripheral region insulating layers 244, 246, and 248 may be disposed on the circuit elements 230 on the base substrate 201.

The contact plugs 250 may penetrate through the peripheral region insulating layer 244 to be connected to the doping region 205. An electrical signal may be applied to the circuit elements 230 by the contact plugs 250. In some example embodiments, the contact plugs 250 may be connected to the circuit gate electrodes 235 in a region. The wiring lines 260 may be connected to the contact plugs 250 and, in some example embodiments, may be disposed in a plurality of layers.

After the peripheral circuit region PERI is manufactured first, the substrate 101 of the cell region CELL may be disposed/manufactured thereabove. The substrate 101 may be formed to have a size identical to or smaller than that of the base substrate 201. The substrate 101 may be formed of polycrystalline silicon. Alternatively, after the substrate 101 is formed of amorphous silicon, it may be single crystallized.

In some example embodiments, the cell region CELL and the peripheral circuit region PERI may be connected to each other in a region. For example, one end of the gate electrodes 130 extending in the y-direction may be electrically connected to the circuit elements 230.

Figure 11:
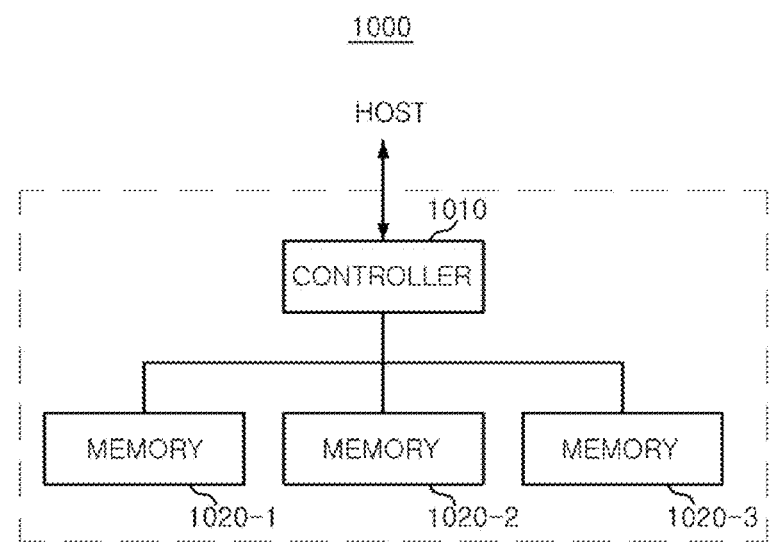
FIG. 11 is a block diagram of a storage apparatus including a semiconductor device according to some example embodiments of present inventive concepts.

FIG. 11 is a block diagram of a storage apparatus including a semiconductor device according to various example embodiments of present inventive concepts. Referring to FIG. 11, a storage apparatus 1000 according to some example embodiments of present inventive concepts may include a controller 1010 communicating with a host, and memories 1020-1, 1020-2 and 1020-3 storing data. The respective memories 1020-1, 1020-2 and 1020-3 may include semiconductor devices according to various embodiments of present inventive concepts described with reference to FIGS. 3 to 5C and FIGS. 8 to 10.

Examples of the host communicating with the controller 1010 may include various electronic devices on which the storage apparatus 1000 is mounted. For example, the host may be a smartphone, a digital camera, a desktop computer, a laptop computer, a media player or the like. The controller 1010 may receive a data writing or reading request transferred from the host to store data in the memories 1020-1, 1020-2 and 1020-3 or generate a command for retrieving data from the memories 1020-1, 1020-2 and 1020-3.

As illustrated in FIG. 11, at least one or more memories 1020-1, 1020-2 and 1020-3 may be connected to the controller 1010 in parallel in the storage apparatus 1000. The plurality of memories 1020-1, 1020-2 and 1020-3 may be connected to the controller 1010 in parallel, whereby the storage apparatus 1000 having a high capacity, such as a solid state drive, may be implemented.

Figure 12:
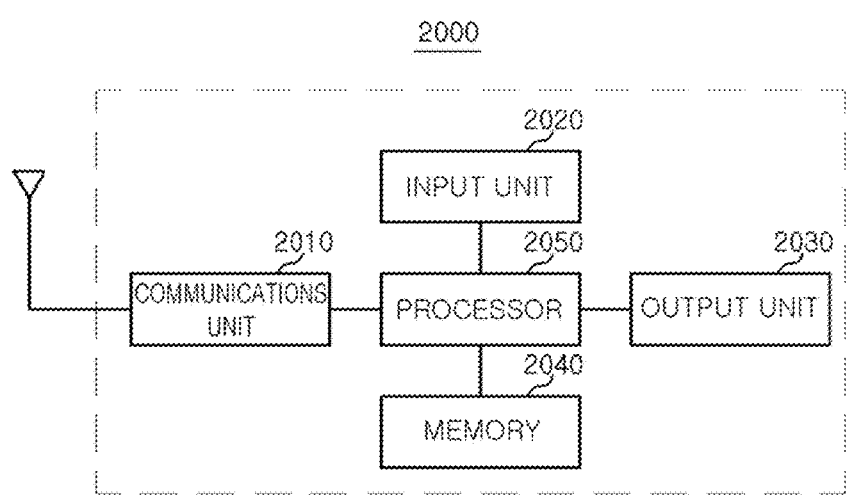
FIG. 12 is a block diagram of an electronic apparatus including a semiconductor device according to some example embodiments of present inventive concepts.

FIG. 12 is a block diagram of an electronic apparatus including a semiconductor device according to various example embodiments of present inventive concepts. Referring to FIG. 12, an electronic apparatus 2000 according to some example embodiments may include a communications unit 2010, an input unit 2020, an output unit 2030, a memory 2040, and a processor 2050.

The communications unit 2010 may include a wired or wireless communications module, a wireless Internet module, a local area communications module, a global positioning system (GPS) module, a mobile communications module, and the like. The wired or wireless communications module included in the communications unit 2010 may be connected to external communications networks according to various communications standard specification to transmit and receive data.

The input unit 2020 may be a module provided to control an operation of the electronic apparatus 2000 by a user and may include a mechanical switch, a touchscreen, a voice recognition module, and the like. In addition, the input unit 2020 may include a mouse operating in a track ball or a laser pointer scheme or a finger mouse device. In addition to these, the input unit 2020 may further include various sensor modules allowing for a user to input data thereto.

The output unit 2030 may output information processed in the electronic apparatus 2000 in a sound or image form, and the memory 2040 may store programs for the processing and the control of the processor 2050. The processor 2050 may transfer a command to the memory 2040 according to a required operation to thereby store or retrieve data.

The memory 2040 may be embedded in the electronic apparatus 2000 to communicate with the processor 2050 or communicate with the processor 2050 through a separate interface. In a case in which the memory 2040 communicates with the processor 2050 through a separate interface, the processor 2050 may store or retrieve data, through various interface standards such as SD, SDHC, SDXC, MICRO SD, USB and the like.

The processor 2050 may control operations of respective components included in the electronic apparatus 2000. The processor 2050 may perform control and processing in association with voice communications, video telephony, data communications, and the like, or may perform control and processing for multimedia reproduction and management. In addition, the processor 2050 may process an input transferred from a user through the input unit 2020 and may output results thereof through the output unit 2030. In addition, the processor 2050 may store data required in controlling the operation of the electronic apparatus 2000 as described above, in the memory 2040, or fetch data from the memory 2040.

At least one of the processor 2050 and the memory 2040 may include semiconductor devices according to various example embodiments of present inventive concepts as described with reference to FIGS. 3 to 5C and FIGS. 8 to 10.

Figure 13:
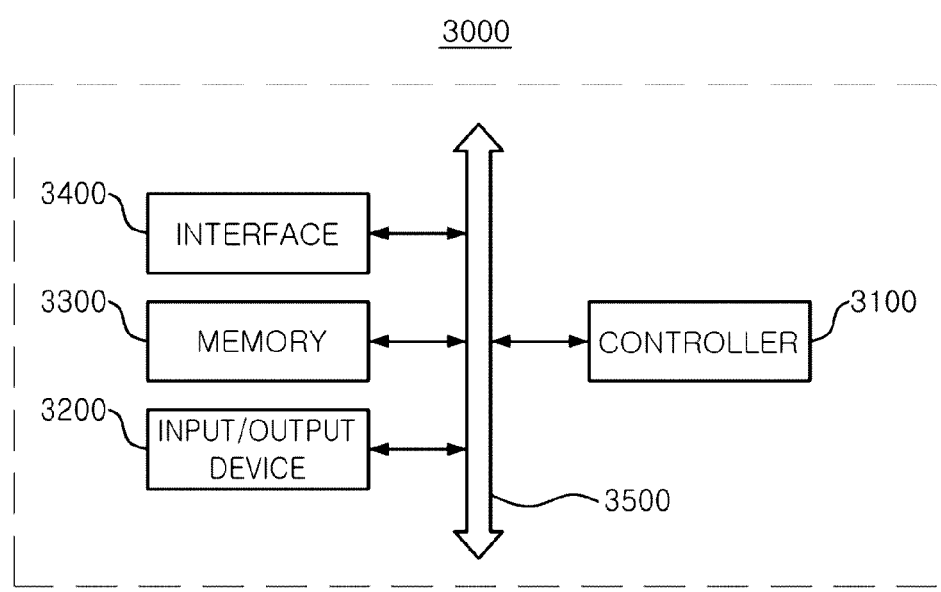
FIG. 13 is a schematic diagram of a system including a semiconductor device according to some example embodiments of present inventive concepts.

FIG. 13 is a schematic diagram of a system including a semiconductor device according to various example embodiments of present inventive concepts. Referring to FIG. 13, a system (e.g., a mobile system) 3000 may include a controller 3100, an input/output device 3200, a memory 3300, and an interface 3400. The system 3000 may transmit or receive information. Examples of the mobile system may include PDAs, portable computers, web tablets, wireless phones, mobile phones, digital music players and memory cards.

The controller 3100 may execute a program and control the system 3000. The controller 3100 may be a microprocessor, a digital signal processor, a microcontroller or device similar thereto.

The input/output device 3200 may be used to input or output data to or from the system 3000. The system 3000 may be connected to an external device, for example, a personal computer or communications network and may exchange data with the external device. The input/output device 3200 may be a keypad, a keyboard, or a display device.

The memory 3300 may store a code and/or data for operating the controller 3100 and/or store data having been processed by the controller 3100. The memory 3300 may include a semiconductor device according to various example embodiments of present inventive concepts.

The interface 3400 may be a data transmission path between the system 3000 and an external device. The controller 3100, the input/output device 3200, the memory 3300, and the interface 3400 may be in communication with one another via a bus 3500.

At least one of the controller 3100 or the memory 3300 may include at least one of the semiconductor devices described with reference to FIGS. 3 to 5C and FIGS. 8 to 10.

As set forth above, according to example embodiments of present inventive concepts, an upwardly convex channel pad may be formed by controlling a thickness of an insulating layer around the channel pad, whereby a semiconductor device having improved reliability may be provided.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
a substrate;
gate electrodes stacked vertically on the substrate;
channel holes penetrating through the gate electrodes to extend in a direction perpendicular to the substrate, the channel holes having respective channel regions therein;
channel pads connected to the channel regions in respective upper portions of the channel holes, the channel pads having respective convex upper surfaces of protruding portions of the channel pads that protrude from the channel holes; and
first and second insulating layers that have an interface with each other adjacent the convex upper surfaces of the channel pads,
wherein the first insulating layer is between the second insulating layer and the substrate,
wherein the channel regions protrude from the first insulating layer, and
wherein the channel pads protrude from the first insulating layer toward the second insulating layer.

2. The semiconductor device of claim 1, wherein the convex upper surfaces of the channel pads comprise dome-shaped upper surfaces that extend away from the substrate.

3. The semiconductor device of claim 1, wherein lower surfaces of the channel pads comprise an opposite curvature of that of the convex upper surfaces of the channel pads.

4. The semiconductor device of claim 1, wherein the channel pads comprise a p-type impurity or an n-type impurity, the semiconductor device further comprising a gate dielectric layer between the gate electrodes and the channel region of one of the channel holes, wherein the gate dielectric layer extends along a side surface of the channel pad that is in the one of the channel holes.

5. The semiconductor device of claim 1, wherein the channel region of one of the channel holes extends along a side surface of the channel pad that is in the one of the channel holes.

6. A semiconductor device, comprising:
a substrate;
a stack of alternating interlayer insulating layers and gate electrodes on the substrate;
a channel hole penetrating through the stack to extend in a direction perpendicular to the substrate;
a channel insulating layer in the channel hole, the channel insulating layer comprising an upwardly-concave upper surface;
a channel region between the channel insulating layer and the stack;
a channel pad on the channel insulating layer, the channel pad comprising an upwardly-convex upper surface; and
first and second insulating layers on the stack, the first and second insulating layers having an interface with each other adjacent the upwardly-convex upper surface of the channel pad,
wherein the first insulating layer is between the second insulating layer and the substrate,
wherein the channel region protrudes from the first insulating layer,
wherein the channel pad protrudes from the first insulating layer toward the second insulating layer, and
wherein a lower surface of the channel pad contacts the upwardly-concave upper surface of the channel insulating layer.

7. A semiconductor device comprising:
a stack of alternating interlayer insulating layers and gate electrodes;
a channel material in a channel recess in the stack;
a channel insulating layer on the channel material, in the channel recess;
a channel pad on the channel insulating layer, the channel pad comprising a convex upper surface of a protruding portion thereof that protrudes from the channel recess; and
first and second insulating layers on the stack, the first and second insulating layers having an interface with each other adjacent the convex upper surface of the channel pad,
wherein the protruding portion of the channel pad protrudes beyond an upper surface of the first insulating layer, and
wherein a portion of the channel material protrudes from the channel recess beyond the upper surface of the first insulating layer.

8. The semiconductor device of claim 7, further comprising a gate dielectric layer between some of the gate electrodes and the channel material.

9. The semiconductor device of claim 7, wherein:
the channel recess comprises one among a plurality of channel recesses in the stack;

the channel pad comprises one among a plurality of channel pads that correspond to the plurality of channel recesses, respectively; and the convex upper surface of the channel pad comprises one among a plurality of dome-shaped upper surfaces of the plurality of channel pads, respectively, protruding beyond the upper surface of the first insulating layer.

10. The semiconductor device of claim 7, wherein the first insulating layer that is on the stack is thicker than individual ones of the interlayer insulating layers, and is 1.5 to 2.5 times thicker than the channel pad.

11. The semiconductor device of claim 10, wherein the first insulating layer is 1000 Å to 2200 Å thick.

12. The semiconductor device of claim 11, wherein the first insulating layer is 1500 Å to 2000 Å thick.

13. The semiconductor device of claim 7, wherein a first width of the convex upper surface of the channel pad is wider than a second width of a lower surface of the channel pad.

14. The semiconductor device of claim 7, further comprising a contact plug on the convex upper surface of the channel pad.

15. The semiconductor device of claim 1, wherein the channel regions contact the second insulating layer.

16. The semiconductor device of claim 3, further comprising channel insulating layers in the channel holes, the channel insulting layers having upwardly-concave upper surfaces, wherein the upwardly-concave upper surfaces of the channel insulating layers contact the lower surfaces of the channel pads.

* * * * *